(12) United States Patent
Baba et al.

(10) Patent No.: US 10,050,326 B2
(45) Date of Patent: Aug. 14, 2018

(54) TRANSMISSION LINE

(71) Applicant: Murata Manufacturing Co., Ltd., Nagaokakyo-shi, Kyoto-fu (JP)

(72) Inventors: Takahiro Baba, Nagaokakyo (JP); Kuniaki Yosui, Nagaokakyo (JP); Nobuo Ikemoto, Nagaokakyo (JP); Fumie Matsuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/366,159

(22) Filed: Dec. 1, 2016

(65) Prior Publication Data

US 2017/0084974 A1 Mar. 23, 2017

Related U.S. Application Data

(63) Continuation of application No. PCT/JP2015/065984, filed on Jun. 3, 2015.

(30) Foreign Application Priority Data

Jun. 5, 2014 (JP) .................................. 2014-116331

(51) Int. Cl.
*H01P 3/08* (2006.01)
*H05K 1/02* (2006.01)
*H01P 11/00* (2006.01)

(52) U.S. Cl.
CPC ............... *H01P 3/08* (2013.01); *H01P 3/085* (2013.01); *H01P 3/088* (2013.01); *H01P 11/003* (2013.01); *H05K 1/02* (2013.01)

(58) Field of Classification Search
CPC .. H01P 3/08; H01P 3/081; H01P 3/082; H01P 3/085; H01P 3/088

(Continued)

(56) References Cited

U.S. PATENT DOCUMENTS

2005/0156692 A1  7/2005  Dove et al.
2014/0048312 A1  2/2014  Kato et al.
2014/0376199 A1  12/2014  Kato et al.

FOREIGN PATENT DOCUMENTS

JP    05-226500 A    9/1993
JP    4962660 B2     6/2012
WO    2013/190589 A1  12/2013

OTHER PUBLICATIONS

Official Communication issued in International Patent Application No. PCT/JP2015/065984, dated Aug. 11, 2015.

*Primary Examiner* — Stephen E Jones
(74) *Attorney, Agent, or Firm* — Keating & Bennett, LLP

(57) ABSTRACT

A transmission line includes, in a dielectric body, a first ground conductor, and first and second signal conductors arranged in a width direction of the dielectric body. The first ground conductor includes a first signal conductor ground portion disposed closer to a first side of the dielectric body in a thickness direction than the first signal conductor, a second signal conductor ground portion disposed closer to a second side of the dielectric body in the thickness direction than the second signal conductor, and an intermediate portion that connects the first signal conductor ground portion to the second signal conductor ground portion. The intermediate portion is disposed between a first transmission line including the first signal conductor and the first signal conductor ground portion and a second transmission line including the second signal conductor and the second signal conductor ground portion.

19 Claims, 10 Drawing Sheets

(58) Field of Classification Search
USPC ........ 333/1, 4, 5, 33, 238, 246; 29/600, 838, 29/846
See application file for complete search history.

TRANSMISSION LINE

CROSS REFERENCE TO RELATED APPLICATIONS

This application claims the benefit of priority to Japanese Patent Application 2014-116331 filed Jun. 5, 2014 and is a Continuation Application of PCT/JP2015/0659984 filed on Jun. 3, 2015. The entire contents of each application are hereby incorporated herein by reference.

BACKGROUND OF THE INVENTION

1. Field of the Invention

The present invention relates to a transmission line in which signal conductors that transmit different high-frequency signals are located close to each other.

2. Description of the Related Art

Various types of transmission lines that transmit high-frequency signals have been proposed. For example, a transmission line described in Japanese Patent No. 4962660 has a stripline structure. The transmission line described in Japanese Patent No. 4962660 includes a long dielectric body, a signal conductor, and first and second ground conductors. The signal conductor is disposed in the middle of the dielectric body in the thickness direction. The first ground conductor and the second ground conductor are arranged, with the signal conductor sandwiched therebetween, in the thickness direction of the dielectric body. The first ground conductor and the second ground conductor are connected to each other by a plurality of via hole conductors (interlayer connection conductors) arranged along the signal conductor. With this configuration, a transmission line having a stripline structure in which the signal conductor is sandwiched between the first and second ground conductors is obtained.

When a plurality of transmission lines, each having a configuration such as that described in Japanese Patent No. 4962660, are arranged close to each other in a communication device, a plurality of signal conductors may be arranged in a single dielectric body. In this case, the plurality of signal conductors may be spaced in a direction orthogonal to the thickness direction of the dielectric body.

That is, the transmission lines each having the structure described in Japanese Patent No. 4962660 may be arranged in a direction orthogonal to the thickness direction of the dielectric body.

As the sizes of electronic devices including a transmission line mounted thereon become smaller, the demand for reducing the size of the transmission line increases. At the same time, when adjacent signal conductors are close to each other, the signal conductors are coupled to each other. For example, when the configuration described above is used, narrowing the width of the transmission line leads to a reduced distance between the signal conductors, which are thus prone to being coupled to each other. As a result, the level of isolation between transmission lines including the signal conductors is reduced.

SUMMARY OF THE INVENTION

Preferred embodiments of the present invention provide a small-size transmission line in which coupling between a plurality of transmission lines is reduced or prevented.

A transmission line according to a preferred embodiment of the present invention includes a plate-shaped dielectric body including a plurality of dielectric layers that are stacked, a first signal conductor and a second signal conductor, and a first ground conductor. The first signal conductor and the second signal conductor are disposed inside the dielectric body, and extend along a transmission direction of high-frequency signals. The first signal conductor and the second signal conductor are spaced in a width direction of the dielectric body orthogonal or substantially orthogonal to the transmission direction. The first ground conductor is a ground conductor disposed inside the dielectric body, and is common to the first signal conductor and the second signal conductor.

The first ground conductor includes a first signal conductor ground portion, a second signal conductor ground portion, and an intermediate portion. The first signal conductor ground portion is a conductor portion disposed closer to a first side of the dielectric body in a thickness direction than the first signal conductor, and facing a principal surface of the first signal conductor. The second signal conductor ground portion is a conductor portion disposed closer to a second side of the dielectric body in the thickness direction than the second signal conductor, and facing a principal surface of the second signal conductor. The intermediate portion is a conductor that connects the first signal conductor ground portion to the second signal conductor ground portion.

Along the thickness direction of the dielectric body, a region between the first signal conductor and the first signal conductor ground portion is defined as a first region, and a region between the second signal conductor and the second signal conductor ground portion is defined as a second region. A second end portion of the second region in the thickness direction is disposed closer to the second side of the dielectric body in the thickness direction than a first end portion of the first region in the thickness direction.

In a transmission line according to a preferred embodiment of the present invention, a first transmission line including at least the first signal conductor and the first signal conductor ground portion and a second transmission line including at least the second signal conductor and the second signal conductor ground portion are adjacent to each other inside the dielectric body in the width direction. The intermediate portion of the first ground conductor is disposed between the first signal conductor and the second signal conductor. The intermediate portion has a predetermined length in a direction (thickness direction) orthogonal or substantially orthogonal to the direction (width direction) in which the first signal conductor and the second signal conductor are connected. With this configuration, coupling between the first signal conductor and the second signal conductor is reduced or prevented even if the distance therebetween is small or narrow.

A transmission line according to a preferred embodiment of the present invention preferably has the following configuration. The transmission line further includes a second ground conductor and a third ground conductor. The second ground conductor is disposed opposite to the first signal conductor ground portion with respect to the first signal conductor in the thickness direction of the first region. The third ground conductor is disposed opposite to the second signal conductor ground portion with respect to the second signal conductor in the thickness direction of the second region.

In a transmission line according to a preferred embodiment of the present invention, the first signal conductor is sandwiched between the first signal conductor ground portion of the first ground conductor and the second ground conductor, and the second signal conductor is sandwiched between the second signal conductor ground portion of the first ground conductor and the third ground conductor. Thus, two stripline transmission lines are provided inside the dielectric body. With this configuration, radiation of electromagnetic waves from each transmission line is prevented from being transmitted to the outside, and the impact of the external environment on each transmission line is significantly reduced or prevented.

A transmission line according to a preferred embodiment of the present invention may preferably have the following configuration. The transmission line further includes a fourth ground conductor and a third signal conductor. The fourth ground conductor is partially disposed opposite to the first ground conductor with respect to the second signal conductor in the thickness direction of the dielectric body. The fourth ground conductor is provided in substantially the entire region in the width direction of the dielectric body. The third signal conductor is disposed opposite to the first signal conductor with respect to the first ground conductor and the fourth ground conductor in the thickness direction of the dielectric body. A first portion of the fourth ground conductor facing the third signal conductor is disposed closer to the first signal conductor than a second portion of the fourth ground conductor facing the second signal conductor is in the thickness direction of the dielectric body.

With this configuration, three transmission lines are provided inside the dielectric body.

A transmission line according to a preferred embodiment of the present invention may preferably have the following configuration. The transmission line further includes a sixth ground conductor and a fourth signal conductor. The sixth ground conductor is partially disposed opposite to the fourth ground conductor with respect to the third signal conductor in the thickness direction of the dielectric body. The sixth ground conductor is provided in substantially the entire region in the width direction of the dielectric body. The fourth signal conductor is disposed opposite to the second signal conductor with respect to the fourth ground conductor and the sixth ground conductor in the thickness direction of the dielectric body. A first portion of the sixth ground conductor facing the fourth signal conductor is disposed closer to the second signal conductor than a second portion of the sixth ground conductor facing the third signal conductor is in the thickness direction of the dielectric body.

With this configuration, four transmission lines are provided inside the dielectric body.

A method for manufacturing the transmission line according to a preferred embodiment of the present invention includes a stacking step and a thermal pressure bonding step. In the stacking step, a first dielectric layer having a width narrower than a width of the dielectric body and provided with the first signal conductor formed thereon, a second dielectric layer having a width narrower than the width of the dielectric body and provided with the second signal conductor formed thereon, and a third dielectric layer having a width the same or substantially the same as the width of the dielectric body and provided with the first ground conductor formed thereon are stacked, in the order of the first dielectric layer, the third dielectric layer, and the second dielectric layer along a stacking direction. In the thermal pressure bonding step, the stacked first dielectric layer, third dielectric layer, and second dielectric layer are thermally pressure-bonded to form the dielectric body including the first dielectric layer, the third dielectric layer, and the second dielectric layer.

In the stacking step, the first dielectric layer and second dielectric layer preferably do not overlap each other as viewed in the stacking direction when the first dielectric layer, the third dielectric layer, and the second dielectric layer are stacked.

With this manufacturing method, the transmission line having the configuration described above is easily manufactured.

Various preferred embodiments of the present invention can provide a small-size transmission line in which coupling between a plurality of transmission lines is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
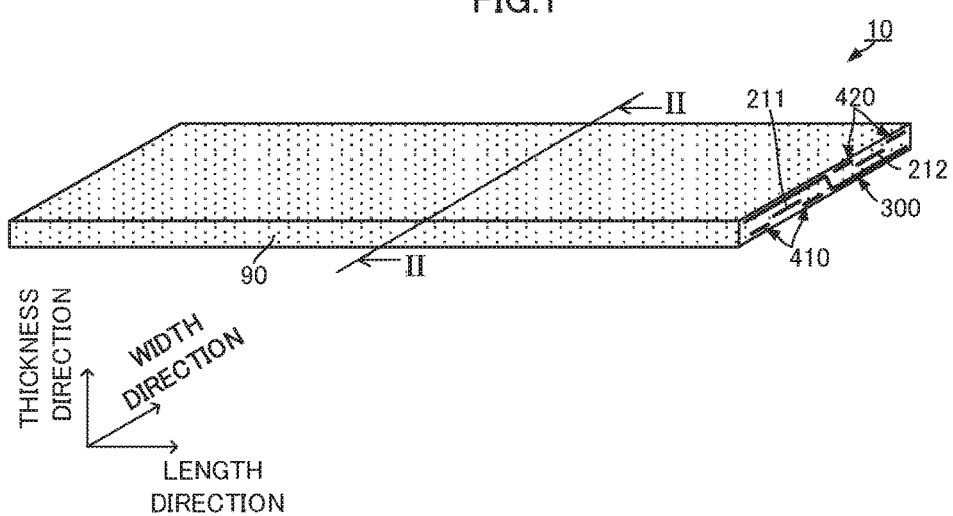
FIG. 1 is an external perspective view of a main portion of a transmission line according to a first preferred embodiment of the present invention.
Figure 2:
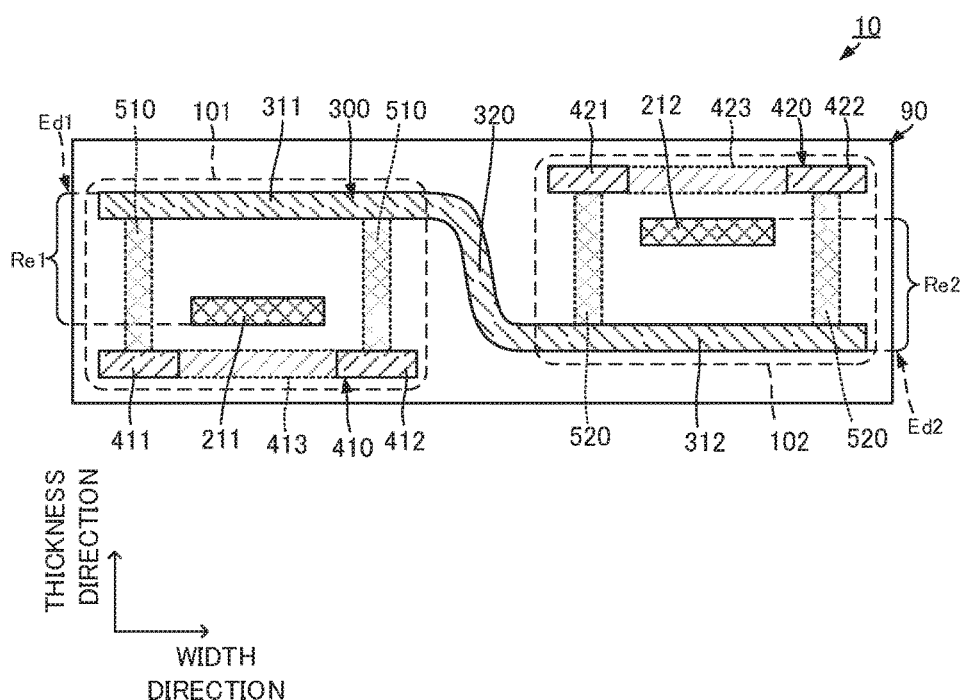
FIG. 2 is a cross-sectional view of the main portion of the transmission line according to the first preferred embodiment of the present invention.
Figure 3:
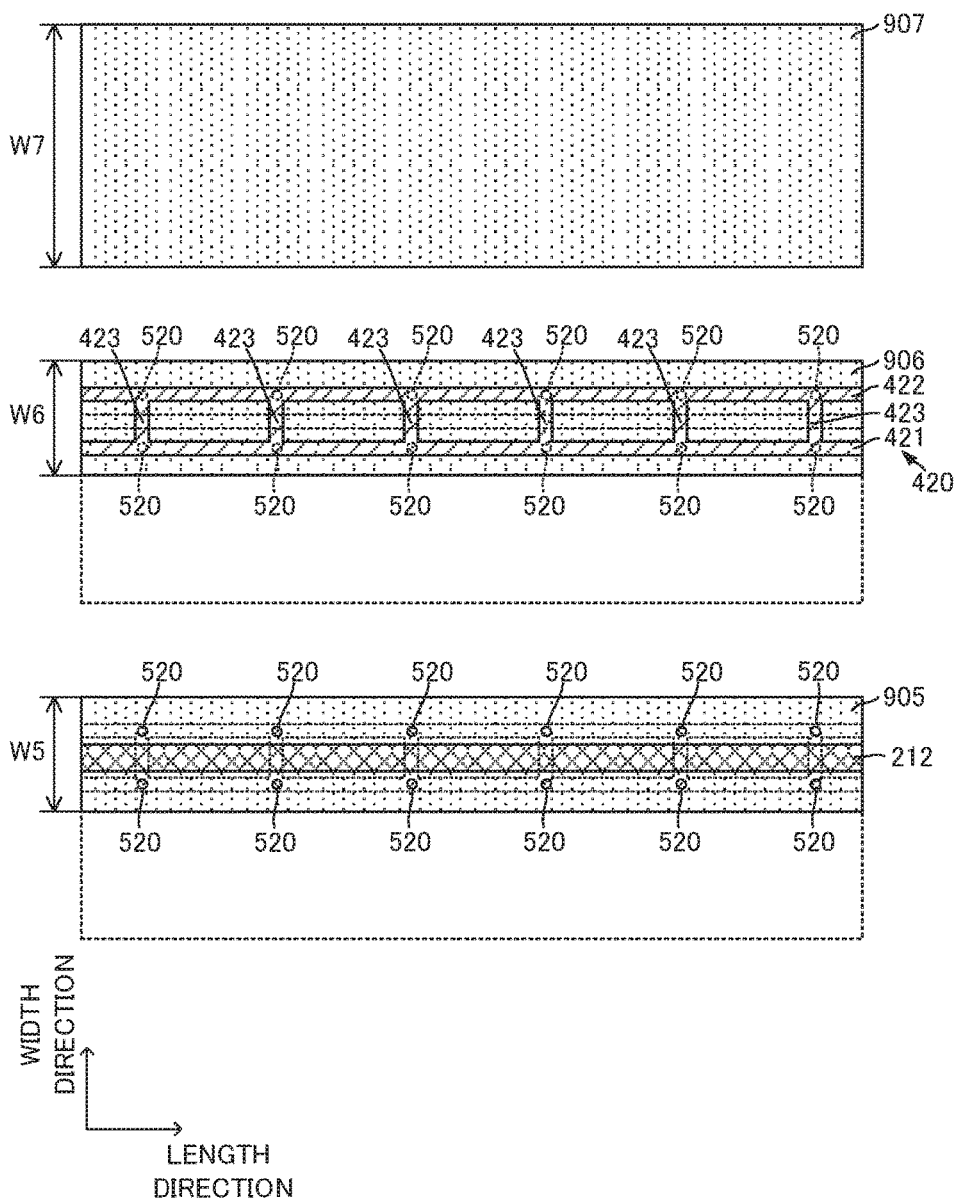
FIG. 3 is a plan view illustrating a configuration of each dielectric layer of the transmission line according to the first preferred embodiment of the present invention.
Figure 4:
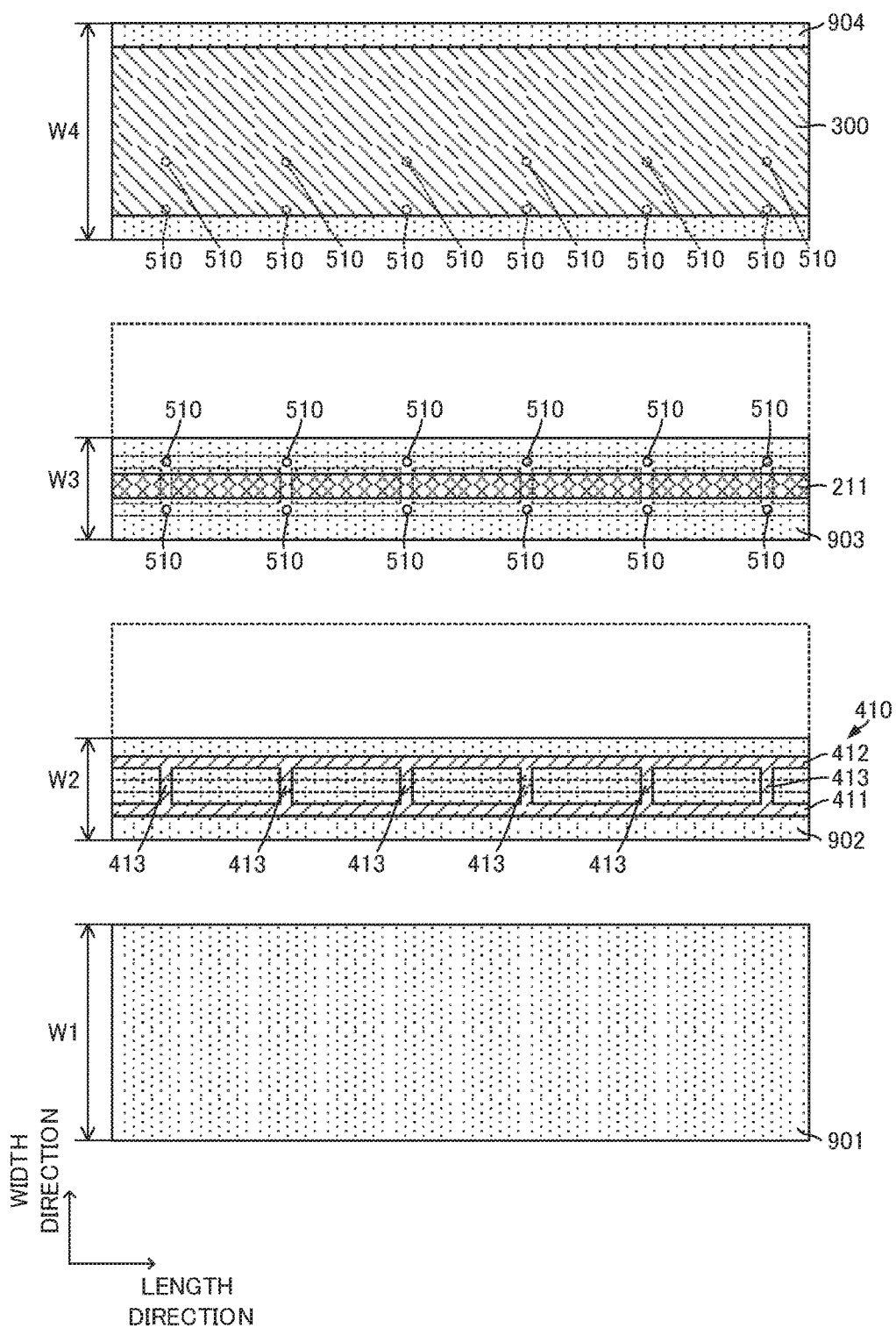
FIG. 4 is a plan view illustrating a configuration of each dielectric layer of the transmission line according to the first preferred embodiment of the present invention.

A transmission line according to a first preferred embodiment of the present invention and a method for manufacturing the transmission line will now be described with reference to the drawings. FIG. 1 is an external perspective view of a main portion of a transmission line according to the first preferred embodiment of the present invention. FIG. 2 is a cross-sectional view of the main portion of the transmission line according to the first preferred embodiment of the present invention. Specifically, FIG. 2 illustrates a cross-section taken along line II-II of FIG. 1. FIG. 3 is a plan view illustrating a configuration of each dielectric layer of the transmission line according to the first preferred embodiment of the present invention, and FIG. 4 is also a plan view illustrating a configuration of each dielectric layer of the transmission line according to the first preferred embodiment of the present invention. Specifically, FIG. 3 illustrates the fifth to seventh layers, and FIG. 4 illustrates the first to fourth layers.

As illustrated in FIG. 1, a transmission line 10 includes a long plate-shaped dielectric body 90. In the dielectric body 90, a length direction corresponds to a transmission direction of high-frequency signals, a direction parallel to a planar surface and orthogonal to the length direction is a width direction, and a direction orthogonal to both the length direction and the width direction is a thickness direction. Note that the dielectric body 90 illustrated in FIG. 1 is the main portion of the transmission line 10. The dielectric body 90 is provided with extended portions (not shown) at both ends thereof in the length direction, and the extended portions are provided with external connection terminals.

As illustrated in FIGS. 1 and 2, the dielectric body includes a first signal conductor 211, a second signal conductor 212, a first ground conductor 300, a second ground conductor 410, a third ground conductor 420, and interlayer connection conductors 510 and 520.

The first signal conductor 211 and the second signal conductor 212 are each preferably a long film-shaped conductor extending along the length direction of the dielectric body 90. The first signal conductor 211 and the second signal conductor 212 are each disposed in the middle or approximate middle of the dielectric body 90 in the thickness direction. The first signal conductor 211 and the second signal conductor 212 are spaced apart from each other in the width direction of the dielectric body 90.

The first ground conductor 300 is preferably a long film-shaped conductor extending along the length direction of the dielectric body 90. The first ground conductor 300 includes three portions, a first signal conductor ground portion 311, a second signal conductor ground portion 312, and an intermediate portion 320, along the width direction thereof. The first signal conductor ground portion 311, the second signal conductor ground portion 312, and the intermediate portion 320 are integrally formed. These portions are disposed in the order of the first signal conductor ground portion 311, the intermediate portion 320, and the second signal conductor ground portion 312, along the width direction of the dielectric body 90, from a first side surface adjacent to the first signal conductor 211 toward a second side surface adjacent to the second signal conductor 212.

The first signal conductor ground portion 311 of the first ground conductor 300 is preferably wider than the first signal conductor 211. The first signal conductor ground portion 311 is disposed closer to a first side (upper side in FIG. 2) of the dielectric body 90 in the thickness direction than the first signal conductor 211. More specifically, the first signal conductor ground portion 311 is disposed near a flat film surface on the first side of the dielectric body 90 in the thickness direction. The first signal conductor ground portion 311 is spaced apart from the first signal conductor 211 in the thickness direction of the dielectric body 90. The first signal conductor ground portion 311 is disposed such that a film surface thereof is parallel or substantially parallel to that of the first signal conductor 211.

The second signal conductor ground portion 312 of the first ground conductor 300 is preferably wider than the second signal conductor 212. The second signal conductor ground portion 312 is disposed closer to a second side (lower side in FIG. 2) of the dielectric body 90 in the thickness direction than the second signal conductor 212. More specifically, the second signal conductor ground portion 312 is disposed near a flat film surface on the second side of the dielectric body 90 in the thickness direction. The second signal conductor ground portion 312 is spaced apart from the second signal conductor 212 in the thickness direction of the dielectric body 90. The second signal conductor ground portion 312 is disposed such that a film surface thereof is parallel or substantially parallel to that of the second signal conductor 212.

The intermediate portion 320 of the first ground conductor 300 is disposed between the first signal conductor 211 and the second signal conductor 212 in the width direction of the dielectric body 90. It is preferable that the film surface of the intermediate portion 320 is closer to being parallel to the thickness direction of the dielectric body 90. In other words, it is preferable that the film surface of the intermediate portion 320 is closer to being orthogonal to the direction in which the first signal conductor 211 and the second signal conductor 212 are arranged.

The second ground conductor 410 is preferably wider than the first signal conductor 211. The second ground conductor 410 is disposed closer to the second side (lower side in FIG. 2) of the dielectric body 90 in the thickness direction than the first signal conductor 211. More specifically, the second ground conductor 410 is disposed near the flat film surface on the second side of the dielectric body 90 in the thickness direction. The second ground conductor 410 is spaced apart from the first signal conductor 211 in the thickness direction of the dielectric body 90. The second ground conductor 410 is disposed such that a film surface thereof is parallel or substantially parallel to that of the first signal conductor 211.

The second ground conductor 410 includes long conductors 411 and 412 and a plurality of bridge conductors 413. The long conductors 411 and 412 extend along the length direction of the dielectric body 90. The long conductors 411 and 412 are arranged, with the first signal conductor 211 interposed therebetween, in the width direction of the dielectric body 90. The long conductors 411 and 412 preferably do not overlap the first signal conductor 211 when the dielectric body 90 is viewed in the thickness direction. As illustrated in FIG. 4, the bridge conductors 413 are arranged at predetermined intervals along the direction in which the long conductors 411 and 412 extend, and connect the long conductors 411 and 412. As illustrated in FIG. 2, the long conductors 411 and 412 are connected by the corresponding interlayer connection conductors 510 to the first signal conductor ground portion 311 of the first ground conductor 300.

The third ground conductor 420 is preferably wider than the second signal conductor 212. The third ground conductor 420 is disposed closer to the first side (upper side in FIG. 2) of the dielectric body 90 in the thickness direction than the second signal conductor 212. More specifically, the third ground conductor 420 is disposed near the flat film surface on the first side of the dielectric body 90 in the thickness direction. The third ground conductor 420 is spaced apart from the second signal conductor 212 in the thickness direction of the dielectric body 90. The third ground conductor 420 is disposed such that a film surface thereof is parallel or substantially parallel to that of the second signal conductor 212.

The third ground conductor 420 includes long conductors 421 and 422 and a plurality of bridge conductors 423. The long conductors 421 and 422 extend along the length direction of the dielectric body 90. The long conductors 421 and 422 are arranged, with the second signal conductor 212 interposed therebetween, in the width direction of the dielectric body 90. The long conductors 421 and 422 preferably do not overlap the second signal conductor 212 when the dielectric body 90 is viewed in the thickness direction. As illustrated in FIG. 3, the bridge conductors 423 are arranged at predetermined intervals along the direction in which the long conductors 421 and 422 extend, and connect the long conductors 421 and 422. As illustrated in FIG. 2, the long conductors 421 and 422 are connected by the corresponding interlayer connection conductors 520 to the second signal conductor ground portion 312 of the first ground conductor 300.

With this configuration, as illustrated in FIG. 2, first and second transmission lines 101 and 102 are provided in the dielectric body 90. The first transmission line 101 is a stripline transmission line in which the first signal conductor 211 is sandwiched between the first signal conductor ground portion 311 of the first ground conductor 300 and the second ground conductor 410 along the thickness direction of the dielectric body 90. The second transmission line 102 is a stripline transmission line in which the second signal conductor 212 is sandwiched between the second signal conductor ground portion 312 of the first ground conductor 300 and the third ground conductor 420 along the thickness direction of the dielectric body 90.

The first transmission line 101 and the second transmission line 102 are transmission lines extending along the length direction of the dielectric body 90 and arranged along the width direction of the dielectric body 90. The intermediate portion 320 of the first ground conductor 300 is disposed between the first transmission line 101 and the second transmission line 102. The intermediate portion 320 includes a film surface orthogonal or substantially orthogonal to the direction in which the first signal conductor 211 and the second signal conductor 212 are arranged. This reduces or prevents electromagnetic field coupling between the first signal conductor 211 and the second signal conductor 212.

Additionally, in the configuration of the present preferred embodiment, the second signal conductor 212 is surrounded by the intermediate portion 320 and the second signal conductor ground portion 312 of the first ground conductor 300 in the direction from the first signal conductor 211 toward the second signal conductor 212. At the same time, the first signal conductor 211 is surrounded by the intermediate portion 320 and the first signal conductor ground portion 311 of the first ground conductor 300 in the direction from the second signal conductor 212 toward the first signal conductor 211. This further reduces or prevents electromagnetic field coupling between the first signal conductor 211 and the second signal conductor 212.

Therefore, even if the first signal conductor 211 and the second signal conductor 212 are close to each other in the width direction of the dielectric body 90, electromagnetic field coupling between the first signal conductor 211 and the second signal conductor 212 is effectively reduced or prevented, and high level of isolation between the first transmission line 101 and the second transmission line 102 is ensured.

The width of the dielectric body 90 is defined by the width over which the first transmission line 101 extends, the width over which the second transmission line 102 extends, the film thickness of the intermediate portion 320 of the first ground conductor 300, and the thicknesses of dielectric layers extending on both sides of the intermediate portion 320 along the thickness direction of the intermediate portion 320. Therefore, the width of the dielectric body 90 can be made narrower than in the case where the first signal conductor 211 and the second signal conductor 212 are arranged along the width direction of the dielectric body 90, with interlayer connection conductors or isolation ground conductors interposed therebetween. Thus, a transmission line 10 having a small size that ensures a high level of isolation between the first transmission line 101 and the second transmission line 102 is obtained.

In the configuration of the present preferred embodiment, a first region Re1 between the first signal conductor 211 and the first signal conductor ground portion 311 in the first transmission line 101 along the thickness direction and a second region Re2 between the second signal conductor 212 and the second signal conductor ground portion 312 in the second transmission line 102 along the thickness direction overlap in the thickness direction of the dielectric body 90. This reduces the profile of the dielectric body 90 and the size of the transmission line 10.

As shown in FIG. 2, a second end portion Ed2 of the second region Re2 in the thickness direction of the dielectric body 90 is disposed closer to the second side of the dielectric body 90 in the thickness direction than a first end portion Ed1 of the first region Re1 in the thickness direction of the dielectric body 90. With this configuration, the size of the transmission line 10 is able to be reduced.

The impedance of the first transmission line 101 in the transmission line 10 described above is determined in the following manner. The shapes of the first signal conductor 211 and the first signal conductor ground portion 311 of the first ground conductor 300 are determined such that the impedance of the first transmission line 101 is preferably about 55Ω, for example, which is slightly higher than about 50Ω. Then, the shape of the second ground conductor 410 is determined such that the characteristic impedance of the first transmission line 101 is preferably about 50Ω, for example. Here, the distance between the first signal conductor 211 and the first signal conductor ground portion 311 is preferably greater than the distance between the first signal conductor 211 and the second ground conductor 410. Thus, it is possible to reduce or prevent capacitive coupling between the first signal conductor 211 and the first signal conductor ground portion 311 having a large conductor facing area therebetween, and to easily achieve a desired impedance of the first transmission line 101.

The impedance of the second transmission line 102 is determined in the following manner. The shapes of the second signal conductor 212 and the second signal conductor ground portion 312 of the first ground conductor 300 are determined such that the impedance of the second transmission line 102 is preferably about 55Ω, for example, which is slightly higher than about 50Ω. Then, the shape of the third ground conductor 420 is determined such that the characteristic impedance of the second transmission line 102 is preferably about 50Ω, for example. Here, the distance between the second signal conductor 212 and the second signal conductor ground portion 312 is preferably greater than the distance between the second signal conductor 212 and the third ground conductor 420. Thus, it is possible to reduce or prevent capacitive coupling between the second signal conductor 212 and the second signal conductor ground portion 312 having a large conductor facing area therebetween, and to easily achieve a desired impedance of the second transmission line 102.

The transmission line 10 having the structure described above is manufactured, for example, in the following non-limiting example of a manufacturing method.

As illustrated in FIGS. 3 and 4, dielectric layers 901, 902, 903, 904, 905, 906, and 907 are prepared. For example, the dielectric layers 901 to 907 can each be obtained by forming a predetermined conductive pattern, as necessary, on a dielectric film made of a material primarily composed of liquid crystal polymer.

As illustrated in FIG. 4, the dielectric layer 901 is formed by a dielectric film including no conductor thereon. A width W1 of the dielectric layer 901 is the same or substantially the same as the width of the dielectric body 90.

The dielectric layer 902 is formed by a dielectric film including a conductor (e.g., copper (Cu)) applied to one side thereof. For example, by patterning the conductor on the surface of the dielectric layer 902, the second ground conductor 410 is formed on the surface of the dielectric layer 902 as illustrated in FIG. 4. A width W2 of the dielectric layer 902 is preferably about half the width of the dielectric body 90 (i.e., about half the width W1 of the dielectric layer 901), for example.

The dielectric layer 903 is formed by a dielectric film including a conductor (e.g., copper (Cu)) applied to one side thereof. For example, by patterning the conductor on the surface of the dielectric layer 903, the first signal conductor 211 is formed on the surface of the dielectric layer 903 as illustrated in FIG. 4. A width W3 of the dielectric layer 903 is preferably about half the width of the dielectric body 90 (i.e., about half the width W1 of the dielectric layer 901), for example, and the same or substantially the same as the width W2 of the dielectric layer 902. The dielectric layer 903 is provided with a plurality of through holes passing therethrough in the thickness direction, in a region that overlaps the second ground conductor 410 when the dielectric layer 903 is disposed over the dielectric layer 902. The surface of the dielectric layer 903 including the first signal conductor 211 thereon is provided with via auxiliary conductors 511 (see FIG. 5) at the respective positions of the through holes. The through holes are each filled with a conductive paste. Thermal pressure bonding of the dielectric layers 901 to 907 enables the conductive paste in the through holes to form a portion of the interlayer connection conductors 510.

The dielectric layer 904 is formed by a dielectric film including a conductor (e.g., copper (Cu)) applied to one side thereof. For example, by patterning the conductor on the surface of the dielectric layer 904, the first ground conductor 300 is formed on the surface of the dielectric layer 904 as illustrated in FIG. 4. A width W4 of the dielectric layer 904 is preferably the same or substantially the same as the width of the dielectric body 90 (i.e., the same or substantially the same as the width W1 of the dielectric layer 901). The first ground conductor 300 is formed on substantially the entire surface of the dielectric layer 904. The first ground conductor 300 preferably does not extend to either end surface of the dielectric layer 904 in the width direction. It is, thus, possible to prevent occurrence of an undesired short circuit between the first ground conductor 300 and an external circuit.

The dielectric layer 904 is provided with a plurality of through holes passing therethrough (except the first ground conductor 300) in the thickness direction in the region where the first ground conductor 300 is formed. The through holes are each filled with a conductive paste. Thermal pressure bonding of the dielectric layers 901 to 907 enables the conductive paste in the through holes to form a portion of the interlayer connection conductors 510.

The dielectric layer 905 is formed by a dielectric film including a conductor (e.g., copper (Cu)) applied to one side thereof. For example, by patterning the conductor on the surface of the dielectric layer 905, the second signal conductor 212 is formed on the surface of the dielectric layer 905 as illustrated in FIG. 3. A width W5 of the dielectric layer 905 is preferably about half the width of the dielectric body 90 (i.e., about half the width W1 of the dielectric layer 901), for example. The dielectric layer 905 is provided with a plurality of through holes passing therethrough in the thickness direction. The surface of the dielectric layer 905 including the second signal conductor 212 thereon is provided with via auxiliary conductors 521 (see FIG. 5) at the respective positions of the through holes. The through holes are each filled with a conductive paste. Thermal pressure bonding of the dielectric layers 901 to 907 enables the conductive paste in the through holes to form a portion of the interlayer connection conductors 520.

The dielectric layer 906 is formed by a dielectric film including a conductor (e.g., copper (Cu)) applied to one side thereof. For example, by patterning the conductor on the surface of the dielectric layer 906, the third ground conductor 420 is formed on the surface of the dielectric layer 906 as illustrated in FIG. 3. A width W6 of the dielectric layer 906 is preferably about half the width of the dielectric body 90 (i.e., about half the width W1 of the dielectric layer 901), for example, and the same or substantially the same as the width W5 of the dielectric layer 905. The dielectric layer 906 is provided with a plurality of through holes passing therethrough (except the third ground conductor 420) in the thickness direction in the region where the third ground conductor 420 is formed. The through holes are each filled with a conductive paste. Thermal pressure bonding of the dielectric layers 901 to 907 enables the conductive paste in the through holes to form a portion of the interlayer connection conductors 520.

As illustrated in FIG. 3, the dielectric layer 907 is formed by a dielectric film including no conductor thereon. A width W7 of the dielectric layer 907 is preferably the same or substantially the same as the width of the dielectric body 90.

Figure 5:
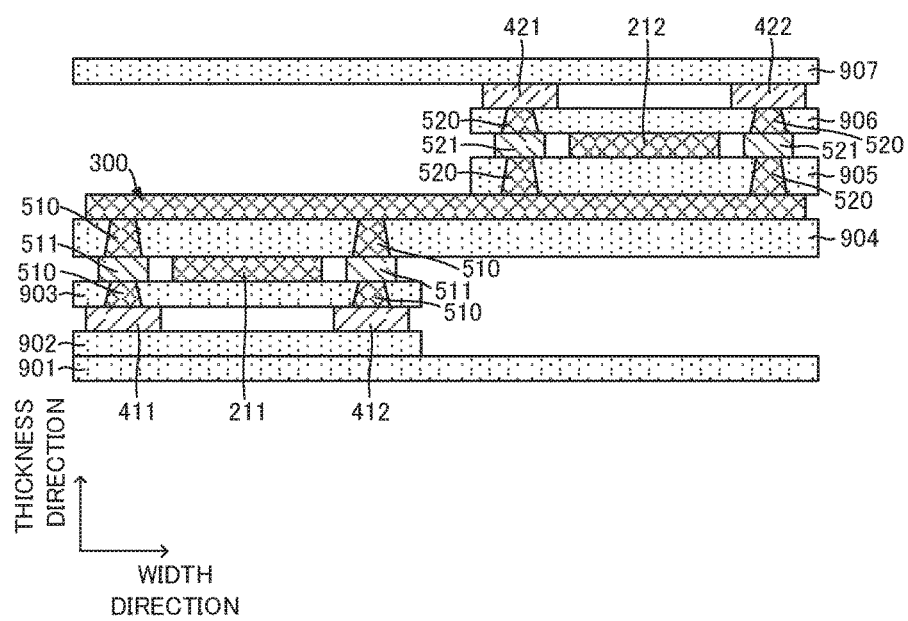
FIG. 5 is a cross-sectional view illustrating a state of the transmission line before thermal pressure bonding according to the first preferred embodiment of the present invention.

As illustrated in FIG. 5, the dielectric layers 901 to 907 configured as described above are stacked in the order of the dielectric layer 901, the dielectric layer 902, the dielectric layer 903, the dielectric layer 904, the dielectric layer 905, the dielectric layer 906, and the dielectric layer 907. FIG. 5 is a cross-sectional view illustrating a state of the transmission line before thermal pressure bonding according to the first preferred embodiment of the present invention.

That is, the dielectric layers 902 and 903 preferably having a width which is about half the width of the dielectric body 90 are stacked between the dielectric layer 901 and the dielectric layer 904 preferably having the same or substantially the same width as the dielectric body 90. Also, the dielectric layer 905 and 906 preferably having a width which is about half the width of the dielectric body 90 are stacked between the dielectric layer 904 and the dielectric layer 907 preferably having the same or substantially the same width as the dielectric body 90.

The dielectric layer 902 and the dielectric layer 903 are stacked to overlap each other. The dielectric layer 905 and the dielectric layer 906 are disposed to overlap each other. The dielectric layers 905 and 906 are disposed so as not to overlap the dielectric layers 902 and 903.

After the dielectric layers 901 to 907 are stacked, the resulting multilayer body is sandwiched by a mold from both ends in the stacking direction and thermally pressure-bonded under predetermined conditions. Thus, the dielectric layer 904 including the first ground conductor 300 formed thereon is bent in the middle or the approximate middle in the width direction (more specifically, bent at a boundary between the region of the dielectric layers 902 and 903 and the region of the dielectric layers 905 and 906 when the multilayer body is viewed in the stacking direction). The first ground conductor 300 is, thus, shaped into the intermediate portion 320 having a flat film surface parallel or substantially parallel to the stacking direction (thickness direction), and the first signal conductor ground portion 311 and the second signal conductor ground portion 312 connected to each other by the intermediate portion 320 and each having a flat film surface orthogonal or substantially orthogonal to the stacking direction.

With the manufacturing method of the present preferred embodiment, the transmission line 10 described above is easily manufactured.

In the manufacturing method of the present preferred embodiment, the width of the dielectric layers 902 and 903 and the width of the dielectric layers 905 and 906 are preferably about half the width of the dielectric body 90. However, the dielectric layers 902 and 903 and the dielectric layers 905 and 906 may be of any size in width, as long as the sum of the width of the dielectric layers 902 and 903 and the width of the dielectric layers 905 and 906 is less than or equal to the width of the dielectric body 90. Although the width of the dielectric layer 902 is the same or substantially the same as the width of the dielectric layer 903 in the manufacturing method of the present preferred embodiment, these widths may be different. Similarly, the width of the dielectric layer 905 and the width of the dielectric layer 906 may be different.

Although the first and second transmission lines 101 and 102 are each formed by a stripline transmission line in the preferred embodiment described above, the first and second transmission lines 101 and 102 may each be formed by a microstrip transmission line. In this case, the second ground conductor 410, the third ground conductor 420, and the interlayer connection conductors 510 and 520 may be omitted. Note, however, that using stripline transmission lines makes it possible to prevent radiation of electromagnetic waves from the first and second transmission lines 101 and 102 to the outside, and also to reduce the impact of external environment on the first and second transmission lines 101 and 102.

Although the dielectric layers 901 to 907 are stacked for each transmission line 10 in the manufacturing method described above, a plurality of transmission lines 10 may be formed at the same time. In this case, a dielectric film is prepared for each type of dielectric layer. In each of the dielectric films, a plurality of dielectric layers corresponding to the dielectric film are arranged. Then, the dielectric films are stacked and thermally pressure-bonded. After the thermal pressure-bonding, the dielectric films are divided into individual transmission lines. In this manufacturing method, a dielectric film including a plurality of dielectric layers 902 and a dielectric film including a plurality of dielectric layers 903 may be provided with through holes or recessed portions in the regions where the dielectric layers 905 and 906 are arranged as viewed in the stacking direction when the dielectric films are in a stacked state. Similarly, a dielectric film including a plurality of dielectric layers 905 and a dielectric film including a plurality of dielectric layers 906 may be provided with through holes or recessed portions in the regions where the dielectric layers 902 and 903 are arranged as viewed in the stacking direction when the dielectric films are in a stacked state. A portion of dielectric films defining the intermediate portion 320 of the first ground conductor 300, as viewed in the stacking direction when the dielectric films are in a stacked state, may also be provided with through holes or recessed portions.

Figure 6:
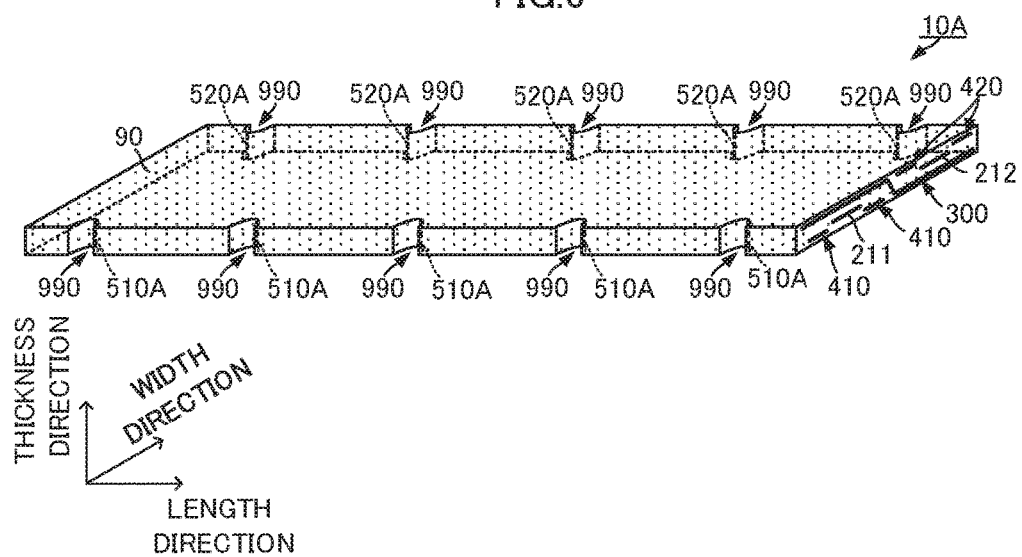
FIG. 6 is an external perspective view of a main portion of a transmission line according to a second preferred embodiment of the present invention.

A transmission line according to a second preferred embodiment of the present invention will now be described with reference to the drawings. FIG. 6 is an external perspective view of a main portion of a transmission line according to the second preferred embodiment of the present invention.

A transmission line 10A according to the second preferred embodiment differs from the transmission line 10 of the first preferred embodiment in the structure of interlayer connection conductors 510A and 520A.

The side surfaces of the dielectric body 90 parallel or substantially parallel to the length direction are provided with a plurality of recessed portions 990 arranged at predetermined intervals. The recessed portions 990 are recessed from the side surfaces of the dielectric body 90 parallel or substantially parallel to the length direction toward the center of the dielectric body 90 in the width direction.

The wall surface of each recessed portion 990 in a first side surface of the dielectric body 90 close to the first signal conductor 211 is provided with the interlayer connection conductor 510A, which connects the first ground conductor 300 to the second ground conductor 410.

The wall surface of each recessed portion 990 in a second side surface of the dielectric body 90 close to the second signal conductor 212 is provided with the interlayer connection conductor 520A, which connects the first ground conductor 300 to the third ground conductor 420.

In this configuration, where the first side surface of the dielectric body 90 is provided with the interlayer connection conductors 510A, the distance between the first signal conductor 211 and each interlayer connection conductor 510A can be greater than the distance between the first signal conductor 211 and each interlayer connection conductor 510 in the first preferred embodiment. Since this enables the width of the first signal conductor 211 to be increased, a conductor loss of the first signal conductor 211 is able to be reduced.

Also in this configuration, where the second side surface of the dielectric body 90 is provided with the interlayer connection conductors 520A, the distance between the second signal conductor 212 and each interlayer connection conductor 520A is able to be greater than the distance between the second signal conductor 212 and each interlayer connection conductor 520 in the first preferred embodiment. Since this enables the width of the second signal conductor 212 to be increased, a conductor loss of the second signal conductor 212 is able to be reduced.

In the configuration of the present preferred embodiment, the interlayer connection conductors 510A and 520A are each provided in the corresponding recessed portion 990 in the side surface of the dielectric body 90. Therefore, the interlayer connection conductors 510A and 520A are prevented from protruding from the side surfaces of the dielectric body 90. Thus, the width of the transmission line 10A is able to be made the same as the width of the dielectric body 90. In this case, for example, the interlayer connection conductors 510A and 520A is prevented from being connected to an undesirable external conductor.

Figure 7:
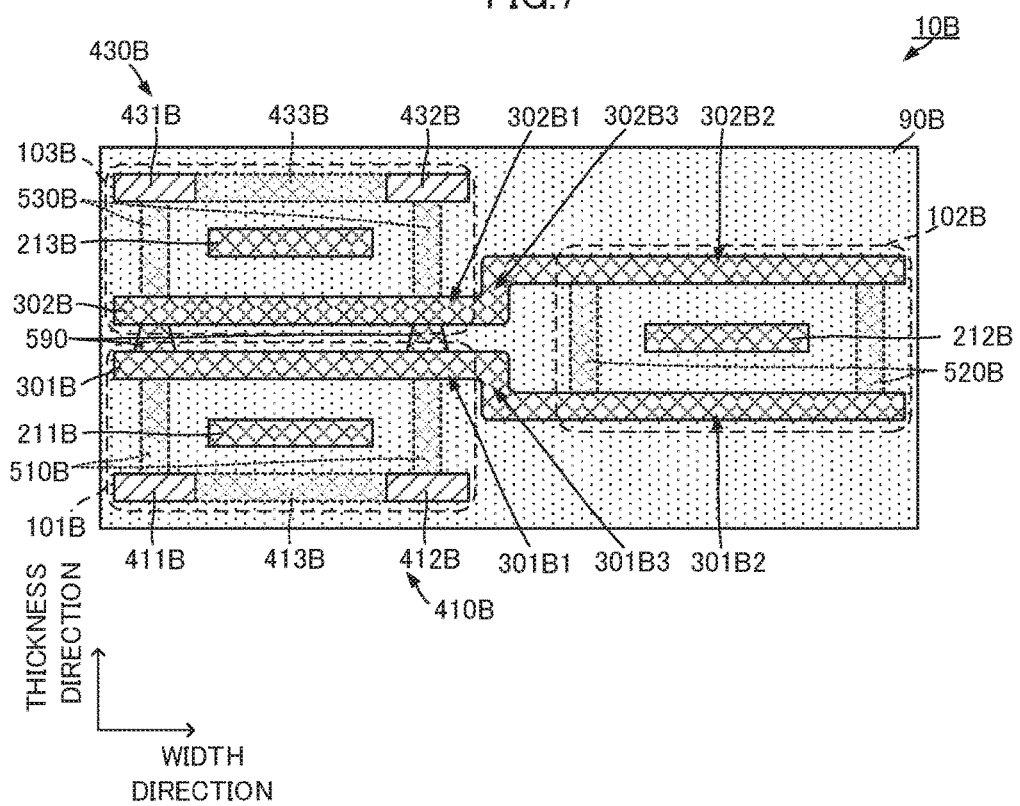
FIG. 7 is a cross-sectional view of a main portion of a transmission line according to a third preferred embodiment of the present invention.
Figure 8:
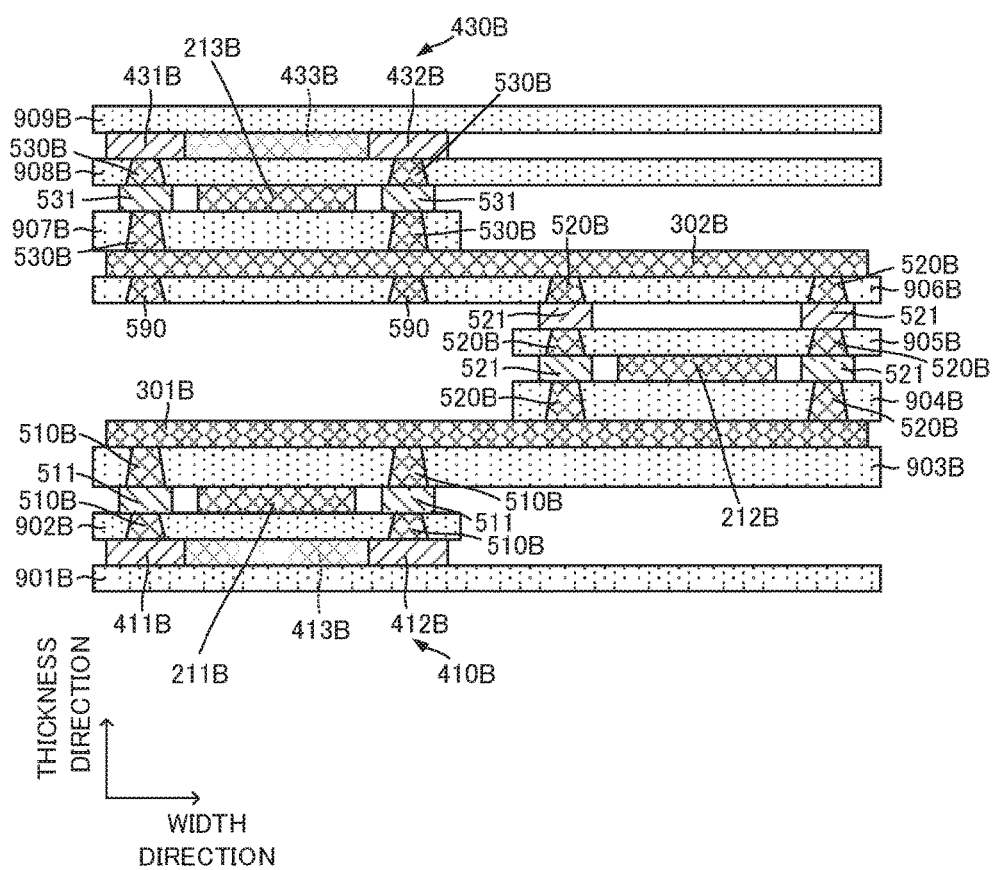
FIG. 8 is a cross-sectional view illustrating a state of the transmission line before thermal pressure bonding according to the third preferred embodiment of the present invention.

A transmission line according to a third preferred embodiment of the present invention will now be described with reference to the drawings. FIG. 7 is a cross-sectional view of a main portion of a transmission line according to the third preferred embodiment of the present invention. FIG. 8 is a cross-sectional view illustrating a state of the transmission line before thermal pressure bonding according to the third preferred embodiment of the present invention.

While the transmission line 10 of the first preferred embodiment includes two transmission lines (the first transmission line 101 and the second transmission line 102), a transmission line 10B of the present preferred embodiment includes three transmission lines (a first transmission line 101B, a second transmission line 102B, and a third transmission line 103B).

The transmission line 10B includes a long plate-shaped dielectric body 90B.

The dielectric body 90B includes a first signal conductor 211B, a second signal conductor 212B, a third signal conductor 213B, a first ground conductor 301B, a second ground conductor 410B, a fourth ground conductor 302B, a fifth ground conductor 430B, and interlayer connection conductors 510B, 520B, and 530B.

The first signal conductor 211B, the second signal conductor 212B, and the third signal conductor 213B are each preferably a long film-shaped conductor extending along the length direction of the dielectric body 90B. The first signal conductor 211B, the second signal conductor 212B, and the third signal conductor 213B are each disposed in the middle or the approximate middle of the dielectric body 90B in the thickness direction. The first signal conductor 211B and the third signal conductor 213B are disposed at the same or substantially the same position in the width direction of the dielectric body 90B. The first signal conductor 211B and the third signal conductor 213B are spaced apart in the thickness direction of the dielectric body 90B. The second signal conductor 212B is spaced apart from the first signal conductor 211B and the third signal conductor 213B in the width direction of the dielectric body 90B.

The first ground conductor 301B is preferably a long film-shaped conductor extending along the length direction of the dielectric body 90B. The first ground conductor 301B includes three portions, a first signal conductor ground portion 301B1, a second signal conductor ground portion 301B2, and an intermediate portion 301B3, along the width direction thereof. The first signal conductor ground portion 301B1, the second signal conductor ground portion 301B2, and the intermediate portion 301B3 are integrally formed. These portions are disposed in the order of the first signal conductor ground portion 301B1, the intermediate portion 301B3, and the second signal conductor ground portion 301B2, along the width direction of the dielectric body 90B, from a first side surface adjacent to the first signal conductor 211B toward a second side surface adjacent to the second signal conductor 212B.

The first signal conductor ground portion 301B1 of the first ground conductor 301B is preferably wider than the first signal conductor 211B. The first signal conductor ground portion 301B1 is disposed closer to a first side (upper side in FIG. 7) of the dielectric body 90B in the thickness direction than the first signal conductor 211B.

The second signal conductor ground portion 301B2 of the first ground conductor 301B is preferably wider than the second signal conductor 212B. The second signal conductor ground portion 301B2 is disposed closer to a second side (lower side in FIG. 7) of the dielectric body 90B in the thickness direction than the second signal conductor 212B.

The intermediate portion 301B3 of the first ground conductor 301B is disposed between the first signal conductor 211B and the second signal conductor 212B in the width direction of the dielectric body 90B. It is preferable that the film surface of the intermediate portion 301B3 is closer to being parallel to the thickness direction of the dielectric body 90B. In other words, it is preferable that the film surface of the intermediate portion 301B3 is closer to being orthogonal to the direction in which the first signal conductor 211B and the second signal conductor 212B are arranged.

The second ground conductor 410B is preferably wider than the first signal conductor 211B. The second ground conductor 410B is disposed closer to the second side (lower side in FIG. 7) of the dielectric body 90B in the thickness direction than the first signal conductor 211B is.

The second ground conductor 410B preferably includes long conductors 411B and 412B and a plurality of bridge conductors 413B. The long conductors 411B and 412B extend along the length direction of the dielectric body 90B. The long conductors 411B and 412B are arranged, with the first signal conductor 211B interposed therebetween, in the width direction of the dielectric body 90B. The long conductors 411B and 412B preferably do not overlap the first signal conductor 211B when the dielectric body 90B is viewed in the thickness direction. The bridge conductors 413B are arranged at intervals along the direction in which the long conductors 411B and 412B extend, and connect the long conductors 411B and 412B. The long conductors 411B and 412B are connected by the corresponding interlayer connection conductors 510B to the first signal conductor ground portion 301B1 of the first ground conductor 301B.

The fourth ground conductor 302B is preferably a long film-shaped conductor extending along the length direction of the dielectric body 90B. The fourth ground conductor 302B includes three portions, a third signal conductor ground portion 302B1, a second signal conductor ground portion 302B2, and an intermediate portion 302B3, along the width direction thereof. The third signal conductor ground portion 302B1, the second signal conductor ground portion 302B2, and the intermediate portion 302B3 are integrally formed. These portions are disposed in the order of the third signal conductor ground portion 302B1, the intermediate portion 302B3, and the second signal conductor ground portion 302B2, along the width direction of the dielectric body 90B, from the first side surface adjacent to the first signal conductor 211B toward the second side surface adjacent to the second signal conductor 212B.

The third signal conductor ground portion 302B1 of the fourth ground conductor 302B is preferably wider than the third signal conductor 213B. The third signal conductor ground portion 302B1 is disposed closer to the second side (lower side in FIG. 7) of the dielectric body 90B in the thickness direction than the third signal conductor 213B.

The second signal conductor ground portion 302B2 of the fourth ground conductor 302B is preferably wider than the second signal conductor 212B. The second signal conductor ground portion 302B2 is disposed closer to the first side (upper side in FIG. 7) of the dielectric body 90B in the thickness direction than the second signal conductor 212B. The second signal conductor ground portion 302B2 and the second signal conductor ground portion 301B2 are connected to each other by the interlayer connection conductors 520B.

The intermediate portion 302B3 of the fourth ground conductor 302B is disposed between the third signal conductor 213B and the second signal conductor 212B in the width direction of the dielectric body 90B. It is preferable that the film surface of the intermediate portion 302B3 is closer to being parallel to the thickness direction of the dielectric body 90B. In other words, it is preferable that the film surface of the intermediate portion 302B3 is closer to being orthogonal to the direction in which the third signal conductor 213B and the second signal conductor 212B are arranged.

The fifth ground conductor 430B is preferably wider than the third signal conductor 213B. The fifth ground conductor 430B is disposed closer to the first side (upper side in FIG.

7) of the dielectric body 90B in the thickness direction than the third signal conductor 213B.

The fifth ground conductor 430B includes long conductors 431B and 432B and a plurality of bridge conductors 433B. The long conductors 431B and 432B extend along the length direction of the dielectric body 90B. The long conductors 431B and 432B are arranged, with the third signal conductor 213B interposed therebetween, in the width direction of the dielectric body 90B. The long conductors 431B and 432B preferably do not overlap the third signal conductor 213B when the dielectric body 90B is viewed in the thickness direction. The bridge conductors 433B are arranged at intervals along the direction in which the long conductors 431B and 432B extend, and connect the long conductors 431B and 432B. The long conductors 431B and 432B are connected by the corresponding interlayer connection conductors 530B to the third signal conductor ground portion 302B1 of the fourth ground conductor 302B.

With this configuration, as illustrated in FIG. 7, the first, second, and third transmission lines 101B, 102B, and 103B are provided in the dielectric body 90B. The first transmission line 101B is preferably a stripline transmission line in which the first signal conductor 211B is sandwiched between the first signal conductor ground portion 301B1 of the first ground conductor 301B and the second ground conductor 410B along the thickness direction of the dielectric body 90B. The second transmission line 102B is preferably a stripline transmission line in which the second signal conductor 212B is sandwiched between the second signal conductor ground portion 301B2 of the first ground conductor 301B and the second signal conductor ground portion 302B2 of the fourth ground conductor 302B along the thickness direction of the dielectric body 90B. The third transmission line 103B is preferably a stripline transmission line in which the third signal conductor 213B is sandwiched between the third signal conductor ground portion 302B1 of the fourth ground conductor 302B and the fifth ground conductor 430B along the thickness direction of the dielectric body 90B.

The first, second, and third transmission lines 101B, 102B, and 103B are transmission lines extending along the length direction of the dielectric body 90B. The first transmission line 101B and the second transmission line 102B are arranged along the width direction of the dielectric body 90B. The first transmission line 101B and the third transmission line 103B are arranged along the thickness direction of the dielectric body 90B. The first transmission line 101B and the third transmission line 103B coincide or overlap with each other in plan view of the dielectric body 90B.

The intermediate portion 301B3 of the first ground conductor 301B is disposed between the first transmission line 101B and the second transmission line 102B. The intermediate portion 301B3 includes a film surface orthogonal or substantially orthogonal to the direction in which the first signal conductor 211B and the second signal conductor 212B are arranged. This prevents electromagnetic field coupling between the first signal conductor 211B and the second signal conductor 212B.

The intermediate portion 302B3 of the fourth ground conductor 302B is disposed between the third transmission line 103B and the second transmission line 102B. The intermediate portion 302B3 includes a film surface orthogonal or substantially orthogonal to the direction in which the third signal conductor 213B and the second signal conductor 212B are arranged. This prevents electromagnetic field coupling between the third signal conductor 213B and the second signal conductor 212B.

The first signal conductor ground portion 301B1 of the first ground conductor 301B and the third signal conductor ground portion 302B1 of the fourth ground conductor 302B are disposed between the first signal conductor 211B and the third signal conductor 213B. This prevents electromagnetic field coupling between the first signal conductor 211B and the third signal conductor 213B.

With this configuration, even if the first signal conductor 211B and the second signal conductor 212B are close to each other in the width direction of the dielectric body 90B and the first signal conductor 211B and the third signal conductor 213B are close to each other in the thickness direction of the dielectric body 90B, electromagnetic field coupling between the first signal conductor 211B, the second signal conductor 212B, and the third signal conductor 213B is prevented. Therefore, a high level of isolation between the first transmission line 101B, the second transmission line 102B, and the third transmission line 103B is ensured.

As in the first preferred embodiment, the width of the dielectric body 90B is able to be reduced. It is, thus, possible to provide a transmission line 10B having a small size that ensures a high level of isolation between the first transmission line 101B, the second transmission line 102B, and the third transmission line 103B.

In the configuration of the present preferred embodiment, a region between the first signal conductor 211B and the first signal conductor ground portion 301B1 in the first transmission line 101B along the thickness direction and a region between the second signal conductor 212B and the second signal conductor ground portion 301B2 in the second transmission line 102B along the thickness direction overlap in the thickness direction of the dielectric body 90B. This reduces the profile of the dielectric body 90B and the size of the transmission line 10B.

Also in the configuration of the present preferred embodiment, a region between the third signal conductor 213B and the third signal conductor ground portion 302B1 in the third transmission line 103B along the thickness direction and a region between the second signal conductor 212B and the second signal conductor ground portion 302B2 in the second transmission line 102B along the thickness direction overlap in the thickness direction of the dielectric body 90B. This reduces the profile of the dielectric body 90B and the size of the transmission line 10B.

Thus, even when the dielectric body 90B includes three transmission lines as described above, it is still possible to provide a transmission line 10B having a narrow width and a low profile.

The impedance of the first transmission line 101B and the third transmission line 103B in the transmission line 10B is able to be determined in the same manner as the impedance of the first and second transmission lines 101 and 102 described in the first preferred embodiment.

In the transmission line 10B, the second signal conductor ground portions 301B2 and 302B2 between which the second signal conductor 212B is sandwiched are both solid conductors (i.e., conductors with no or only a few openings). Therefore, the impedance of the second transmission line 102B is able to be determined in the same manner as the impedance of a typical stripline transmission line. Here, the distance between the second signal conductor 212B and the second signal conductor ground portion 301B2 and the distance between the second signal conductor 212B and the second signal conductor ground portion 302B2 are preferably longer than the distance between the signal conductor and the ground conductor in both the first transmission line 101B and the third transmission line 103B. Thus, capacitive coupling between the second signal conductor 212B and the second signal conductor ground portion 301B2 is effectively reduced or prevented, and a desired impedance is easily achieved.

In the transmission line 10B, the first signal conductor ground portion 301B1 of the first ground conductor 301B and the third signal conductor ground portion 302B1 of the fourth ground conductor 302B are close to each other in the thickness direction of the dielectric body 90B. Also, the first signal conductor ground portion 301B1 and the third signal conductor ground portion 302B1 are connected to each other by a plurality of interlayer connection conductors 590. It is, thus, possible to reduce a potential difference between the ground conductors.

In plan view of the dielectric body 90B, the interlayer connection conductors 590 are disposed at positions coinciding or overlapping with the interlayer connection conductors 510B and 530B. This reduces the deformation of the first signal conductor ground portion 301B1 of the first ground conductor 301B and the third signal conductor ground portion 302B1 of the fourth ground conductor 302B during molding of the dielectric body 90B. It is, thus, possible to reduce changes in the positional relationship between the signal and ground conductors caused by molding, and to achieve a desired impedance.

The transmission line 10B having the structure described above is manufactured, for example, in the following non-limiting example of a manufacturing method.

As illustrated in FIG. 8, dielectric layers 901B, 902B, 903B, 904B, 905B, 906B, 907B, 908B, and 909B are prepared. For example, the dielectric layers 901B to 909B can each be obtained by forming a predetermined conductive pattern, as necessary, on a dielectric film made of a material primarily composed of liquid crystal polymer.

The dielectric layer 901B is formed by a dielectric film including a conductor (e.g., copper (Cu)) applied to one side thereof. For example, by patterning the conductor on the surface of the dielectric layer 901B, the second ground conductor 410B is formed on the surface of the dielectric layer 901B as illustrated in FIG. 8. The width of the dielectric layer 901B is preferably the same or substantially the same as the width of the dielectric body 90B. The second ground conductor 410B is formed in a first half region of the dielectric body 90B in the width direction.

The dielectric layer 902B is formed by a dielectric film including a conductor (e.g., copper (Cu)) applied to one side thereof. For example, by patterning the conductor on the surface of the dielectric layer 902B, the first signal conductor 211B and the via auxiliary conductors 511 are formed on the surface of the dielectric layer 902B as illustrated in FIG. 8. The width of the dielectric layer 902B is preferably about half the width of the dielectric body 90B. The dielectric layer 902B is disposed in the first half region of the dielectric body 90B in the width direction.

The via auxiliary conductors 511 are provided in regions that overlap the corresponding long conductors 411B and 412B of the second ground conductor 410B when the dielectric layer 902B is disposed over the dielectric layer 901B. The dielectric layer 902B is provided with a plurality of through holes passing therethrough in the thickness direction, in regions that overlap the corresponding long conductors 411B and 412B of the second ground conductor 410B (i.e., regions coinciding or overlapping with the respective via auxiliary conductors 511) when the dielectric layer 902B is disposed over the dielectric layer 901B. The through holes are each filled with a conductive paste. Thermal pressure bonding of the dielectric layers 901B to 909B enables the conductive paste in the through holes to form a portion of the interlayer connection conductors 510B as well as the via auxiliary conductors 511.

The dielectric layer 903B is formed by a dielectric film including a conductor (e.g., copper (Cu)) applied to one side thereof. For example, by patterning the conductor on the surface of the dielectric layer 903B, the first ground conductor 301B is formed on the surface of the dielectric layer 903B as illustrated in FIG. 8. The width of the dielectric layer 903B is preferably the same or substantially the same as the width of the dielectric body 90B. The first ground conductor 301B is formed on substantially the entire surface of the dielectric layer 903B. The first ground conductor 301B preferably does not extend to either end surface of the dielectric layer 903B in the width direction. It is, thus, possible to prevent the occurrence of an undesired short circuit between the first ground conductor 301B and an external circuit.

The dielectric layer 903B is provided with a plurality of through holes passing therethrough (except the first ground conductor 301B) in the thickness direction in the region where the first ground conductor 301B is formed. The through holes are each filled with a conductive paste. Thermal pressure bonding of the dielectric layers 901B to 909B enables the conductive paste in the through holes to form a portion of the interlayer connection conductors 510B.

The dielectric layer 904B is formed by a dielectric film including a conductor (e.g., copper (Cu)) applied to one side thereof. For example, by patterning the conductor on the surface of the dielectric layer 904B, the second signal conductor 212B and the via auxiliary conductors 521 are formed on the surface of the dielectric layer 904B as illustrated in FIG. 8. The width of the dielectric layer 904B is preferably about half the width of the dielectric body 90B. The dielectric layer 904B is disposed in a second half region of the dielectric body 90B in the width direction. The via auxiliary conductors 521 are arranged, with the second signal conductor 212B interposed therebetween, in the width direction of the dielectric layer 904B. The dielectric layer 904B is provided with a plurality of through holes passing therethrough in the thickness direction, in regions that coincide or overlap with the respective via auxiliary conductors 521. The through holes are each filled with a conductive paste. Thermal pressure bonding of the dielectric layers 901B to 909B enables the conductive paste in the through holes to form a portion of the interlayer connection conductors 520B as well as the via auxiliary conductors 521.

The dielectric layer 905B is formed by a dielectric film including a conductor (e.g., copper (Cu)) applied to one side thereof. For example, by patterning the conductor on the surface of the dielectric layer 905B, the via auxiliary conductors 521 are formed on the surface of the dielectric layer 905B as illustrated in FIG. 8. The width of the dielectric layer 905B is preferably about half the width of the dielectric body 90B. The dielectric layer 905B is disposed in the second half region of the dielectric body 90B in the width direction. The via auxiliary conductors 521 are provided at positions that coincide or overlap with the respective via auxiliary conductors 521 on the dielectric layer 904B when the dielectric layer 905B is disposed over the dielectric layer 904B. The dielectric layer 905B is provided with a plurality of through holes passing therethrough in the thickness direction, in regions that coincide or overlap with the via auxiliary conductors 521. The through holes are each filled with a conductive paste. Thermal pressure bonding of the dielectric layers 901B to 909B enables the conductive paste in the through holes to form a portion of the interlayer connection conductors 520B as well as the via auxiliary conductors 521. The dielectric layer 905B is a dielectric layer that adjusts the impedance of the second transmission line 102B by setting the distance between the second signal conductor 212B and the fourth ground conductor 302B at a predetermined value.

The dielectric layer 906B is formed by a dielectric film including a conductor (e.g., copper (Cu)) applied to one side thereof. For example, by patterning the conductor on the surface of the dielectric layer 906B, the fourth ground conductor 302B is formed on the surface of the dielectric layer 906B as illustrated in FIG. 8. The width of the dielectric layer 906B is preferably the same or substantially the same as the width of the dielectric body 90B. The fourth ground conductor 302B is formed on substantially the entire surface of the dielectric layer 906B. The fourth ground conductor 302B preferably does not extend to either end surface of the dielectric layer 906B in the width direction. It is, thus, possible to prevent the occurrence of an undesired short circuit between the fourth ground conductor 302B and an external circuit.

The dielectric layer 906B is provided with a plurality of through holes passing therethrough (except the fourth ground conductor 302B) in the thickness direction in the region where the fourth ground conductor 302B is formed. The through holes are each filled with a conductive paste. Thermal pressure bonding of the dielectric layers 901B to 909B enables the conductive paste in the through holes in the second half region of the dielectric body 90B in the width direction to form a portion of the interlayer connection conductors 520B. At the same time, thermal pressure bonding of the dielectric layers 901B to 909B enables the conductive paste in the through holes in the first half region of the dielectric body 90B in the width direction to form a portion of the interlayer connection conductors 590.

The dielectric layer 907B is formed by a dielectric film including a conductor (e.g., copper (Cu)) applied to one side thereof. For example, by patterning the conductor on the surface of the dielectric layer 907B, the third signal conductor 213B and via auxiliary conductors 531 are formed on the surface of the dielectric layer 907B as illustrated in FIG. 8. The width of the dielectric layer 907B is preferably about half the width of the dielectric body 90B. The dielectric layer 907B is disposed in the first half region of the dielectric body 90B in the width direction. The via auxiliary conductors 531 are arranged, with the third signal conductor 213B interposed therebetween, in the width direction of the dielectric layer 907B. The dielectric layer 907B is provided with a plurality of through holes passing therethrough in the thickness direction, in regions that coincide or overlap with the respective via auxiliary conductors 531. The through holes are each filled with a conductive paste. Thermal pressure bonding of the dielectric layers 901B to 909B enables the conductive paste in the through holes to form a portion of the interlayer connection conductors 530B as well as the via auxiliary conductors 531.

The dielectric layer 908B is formed by a dielectric film including a conductor (e.g., copper (Cu)) applied to one side thereof. For example, by patterning the conductor on the surface of the dielectric layer 908B, the fifth ground conductor 430B is formed on the surface of the dielectric layer 908B as illustrated in FIG. 8. The width of the dielectric layer 908B is preferably the same or substantially the same as the width of the dielectric body 90B. The fifth ground conductor 430B is formed in the first half region of the dielectric body 90B in the width direction, and no conductor is formed in the second half region of the dielectric body 90B in the width direction. With this portion of the dielectric layer 908B in the second half region, the thickness of the dielectric body 90B is able to be made uniform.

The dielectric layer 909B is formed by a dielectric film including no conductor thereon. The width of the dielectric layer 909B is preferably the same or substantially the same as the width of the dielectric body 90B.

As illustrated in FIG. 8, the dielectric layers 901B to 909B configured as described above are stacked in the order of the dielectric layer 901B, the dielectric layer 902B, the dielectric layer 903B, the dielectric layer 904B, the dielectric layer 905B, the dielectric layer 906B, the dielectric layer 907B, the dielectric layer 908B, and the dielectric layer 909B.

After the dielectric layers 901B to 909B are stacked, the resulting multilayer body is sandwiched by a mold from both ends in the stacking direction and thermally pressure-bonded under predetermined conditions. Thus, the dielectric layer 903B including the first ground conductor 301B formed thereon is bent in the middle in the width direction (more specifically, bent at a boundary between the region of the dielectric layer 902B and the region of the dielectric layers 904B and 905B when the multilayer body is viewed in the stacking direction). The first ground conductor 301B is, thus, shaped into the intermediate portion 301B3 having a flat film surface parallel or substantially parallel to the stacking direction (thickness direction), and the first signal conductor ground portion 301B1 and the second signal conductor ground portion 301B2 connected to each other by the intermediate portion 301B3 and each having a flat film surface orthogonal or substantially orthogonal to the stacking direction. At the same time, the dielectric layer 906B including the fourth ground conductor 302B formed thereon is bent in the middle in the width direction (more specifically, bent at a boundary between the region of the dielectric layers 904B and 905B and the region of the dielectric layer 907B when the multilayer body is viewed in the stacking direction). The fourth ground conductor 302B is, thus, shaped into the intermediate portion 302B3 having a flat film surface parallel or substantially parallel to the stacking direction (thickness direction), and the third signal conductor ground portion 302B1 and the second signal conductor ground portion 302B2 connected to each other by the intermediate portion 302B3 and each having a flat film surface orthogonal or substantially orthogonal to the stacking direction.

With the manufacturing method of the present preferred embodiment, the transmission line 10B described above is easily manufactured.

Figure 9:
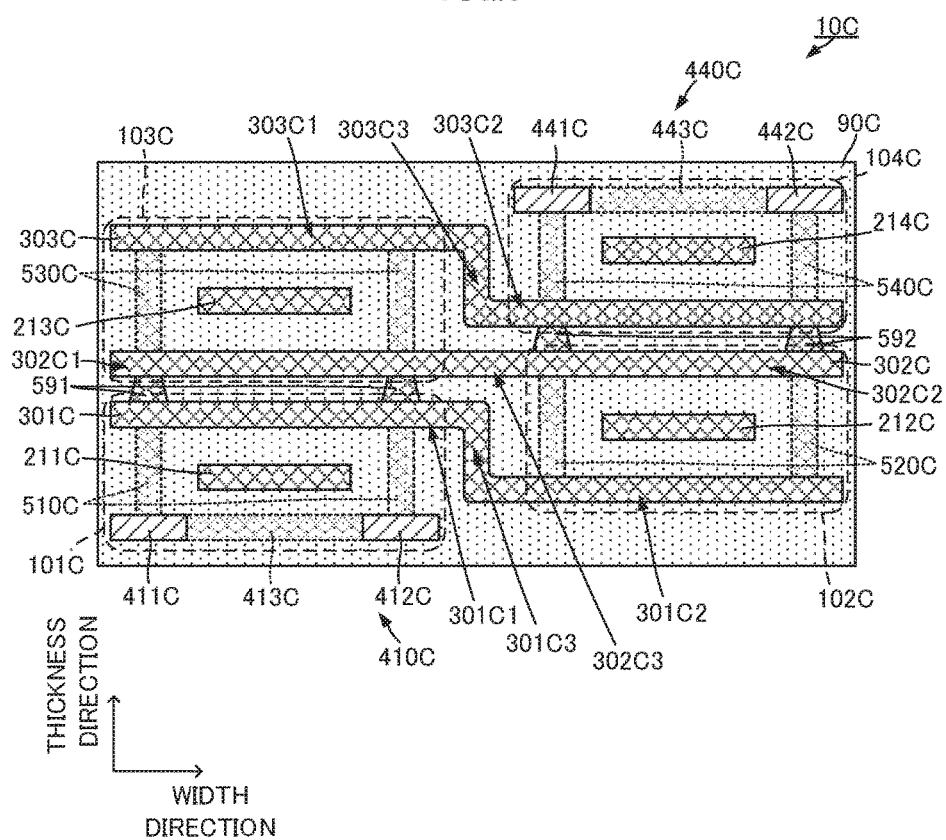
FIG. 9 is a cross-sectional view of a main portion of a transmission line according to a fourth preferred embodiment of the present invention.

A transmission line according to a fourth preferred embodiment of the present invention will now be described with reference to the drawings. FIG. 9 is a cross-sectional view of a main portion of a transmission line according to the fourth preferred embodiment of the present invention.

Figure 10:
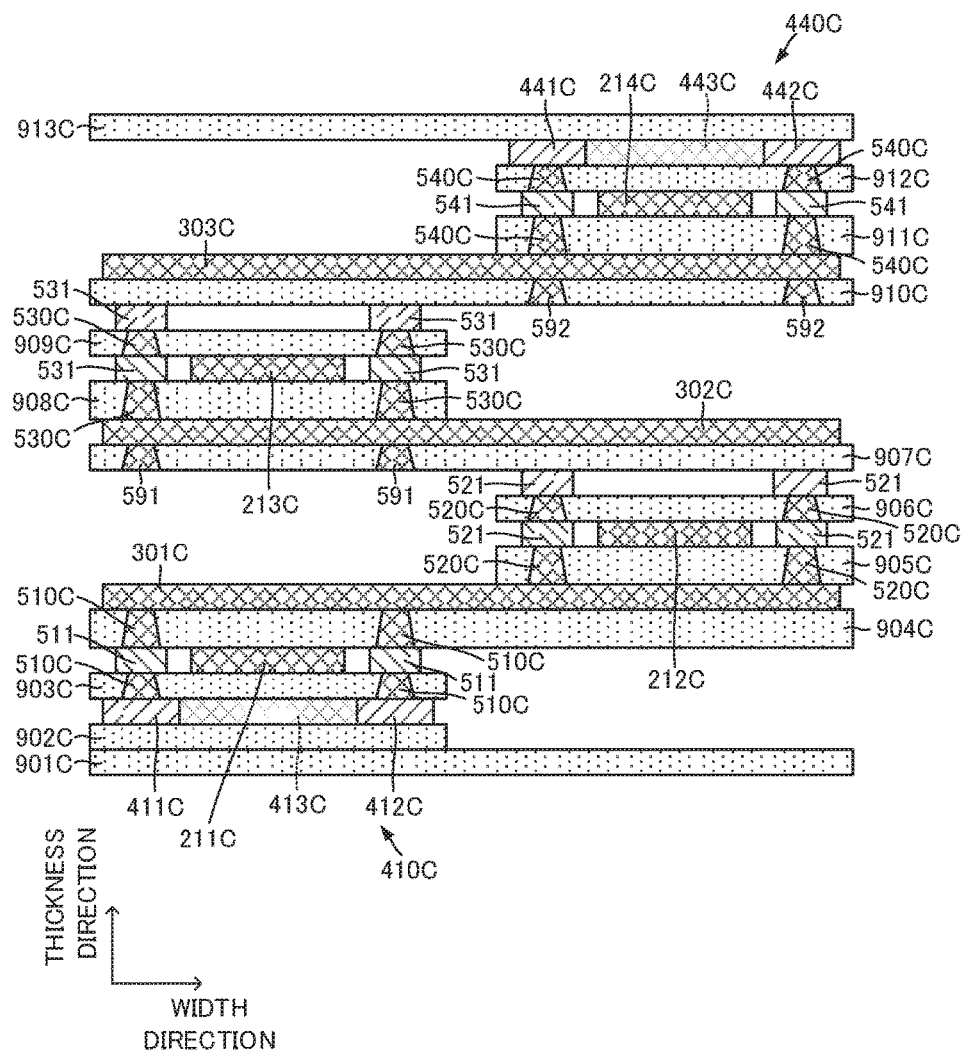
FIG. 10 is a cross-sectional view illustrating a state of the transmission line before thermal pressure bonding according to the fourth preferred embodiment of the present invention.

FIG. 10 is a cross-sectional view illustrating a state of the transmission line before thermal pressure bonding according to the fourth preferred embodiment of the present invention.

While the transmission line 10 of the first preferred embodiment includes two transmission lines (the first transmission line 101 and the second transmission line 102), a transmission line 100 of the present preferred embodiment includes four transmission lines (a first transmission line 101C, a second transmission line 102C, a third transmission line 103C, and a fourth transmission line 104C).

The transmission line 100 includes a long plate-shaped dielectric body 90C.

The dielectric body 90C includes a first signal conductor 211C, a second signal conductor 212C, a third signal conductor 213C, a fourth signal conductor 214C, a first ground conductor 301C, a second ground conductor 410C, a fourth ground conductor 302C, a sixth ground conductor 303C, a seventh ground conductor 440C, and interlayer connection conductors 510C, 520C, 530C, and 540C.

The first signal conductor 211C, the second signal conductor 212C, the third signal conductor 213C, and the fourth signal conductor 214C are each preferably a long film-shaped conductor extending along the length direction of the dielectric body 90C. The first signal conductor 211C, the second signal conductor 212C, the third signal conductor 213C, and the fourth signal conductor 214C are each disposed in the middle or the approximate middle of the dielectric body 90C in the thickness direction. The first signal conductor 211C and the third signal conductor 213C are disposed at the same or substantially the same position in the width direction of the dielectric body 90C. The first signal conductor 211C and the third signal conductor 213C are spaced apart in the thickness direction of the dielectric body 90C. The second signal conductor 212C and the fourth signal conductor 214C are disposed at the same or substantially the same position in the width direction of the dielectric body 90C. The second signal conductor 212C and the fourth signal conductor 214C are spaced apart in the thickness direction of the dielectric body 90C. The second signal conductor 212C and the fourth signal conductor 214C are spaced apart from the first signal conductor 211C and the third signal conductor 213C in the width direction of the dielectric body 90C.

The first ground conductor 301C is a preferably long film-shaped conductor extending along the length direction of the dielectric body 90C. The first ground conductor 301C includes three portions, a first signal conductor ground portion 301C1, a second signal conductor ground portion 301C2, and an intermediate portion 301C3, along the width direction thereof. The first signal conductor ground portion 301C1, the second signal conductor ground portion 301C2, and the intermediate portion 301C3 are integrally formed. These portions are disposed in the order of the first signal conductor ground portion 301C1, the intermediate portion 301C3, and the second signal conductor ground portion 301C2, along the width direction of the dielectric body 90C, from a first side surface adjacent to the first signal conductor 211C toward a second side surface adjacent to the second signal conductor 212C.

The first signal conductor ground portion 301C1 of the first ground conductor 301C is preferably wider than the first signal conductor 211C. The first signal conductor ground portion 301C1 is preferably disposed closer to a first side (upper side in FIG. 9) of the dielectric body 90C in the thickness direction than the first signal conductor 211C.

The second signal conductor ground portion 301C2 of the first ground conductor 301C is preferably wider than the second signal conductor 212C. The second signal conductor ground portion 301C2 is preferably disposed closer to a second side (lower side in FIG. 9) of the dielectric body 90C in the thickness direction than the second signal conductor 212C.

The intermediate portion 301C3 of the first ground conductor 301C is disposed between the first signal conductor 211C and the second signal conductor 212C in the width direction of the dielectric body 90C. It is preferable that the film surface of the intermediate portion 301C3 is closer to being parallel to the thickness direction of the dielectric body 90C. In other words, it is preferable that the film surface of the intermediate portion 301C3 is closer to being orthogonal to the direction in which the first signal conductor 211C and the second signal conductor 212C are arranged.

The second ground conductor 410C is preferably wider than the first signal conductor 211C. The second ground conductor 410C is preferably disposed closer to the second side (lower side in FIG. 9) of the dielectric body 90C in the thickness direction than the first signal conductor 211C is.

The second ground conductor 410C includes long conductors 411C and 412C and a plurality of bridge conductors 413C. The long conductors 411C and 412C extend along the length direction of the dielectric body 90C. The long conductors 411C and 412C are arranged, with the first signal conductor 211C interposed therebetween, in the width direction of the dielectric body 90C. The long conductors 411C and 412C preferably do not overlap the first signal conductor 211C when the dielectric body 90C is viewed in the thickness direction. The bridge conductors 413C are arranged at intervals along the direction in which the long conductors 411C and 412C extend, and connect the long conductors 411C and 412C. The long conductors 411C and 412C are connected by the corresponding interlayer connection conductors 510C to the first signal conductor ground portion 301C1 of the first ground conductor 301C.

The fourth ground conductor 302C is preferably a long film-shaped conductor extending along the length direction of the dielectric body 90C. The fourth ground conductor 302C includes three portions, a third signal conductor ground portion 302C1, a second signal conductor ground portion 302C2, and an intermediate portion 302C3, along the width direction thereof. The third signal conductor ground portion 302C1, the second signal conductor ground portion 302C2, and the intermediate portion 302C3 are integrally formed. These portions are disposed in the order of the third signal conductor ground portion 302C1, the intermediate portion 302C3, and the second signal conductor ground portion 302C2, along the width direction of the dielectric body 90C, from the first side surface adjacent to the third signal conductor 213C toward the second side surface adjacent to the second signal conductor 212C.

The third signal conductor ground portion 302C1 of the fourth ground conductor 302C is preferably wider than the third signal conductor 213C. The third signal conductor ground portion 302C1 is preferably disposed closer to the second side (lower side in FIG. 9) of the dielectric body 90C in the thickness direction than the third signal conductor 213C.

The second signal conductor ground portion 302C2 of the fourth ground conductor 302C is preferably wider than the second signal conductor 212C. The second signal conductor ground portion 302C2 is preferably disposed closer to the first side (upper side in FIG. 9) of the dielectric body 90C in the thickness direction than the second signal conductor 212C.

The intermediate portion 302C3 of the fourth ground conductor 302C is disposed between the third signal conductor 213C and the second signal conductor 212C in the width direction of the dielectric body 90C. The fourth ground conductor 302C has a generally flat shape in a direction orthogonal or substantially orthogonal to the thickness direction of the dielectric body 90C. That is, the third signal conductor ground portion 302C1, the intermediate portion 302C3, and the second signal conductor ground portion 302C2 are disposed at the same or substantially the same position in the thickness direction of the dielectric body 90C.

The sixth ground conductor 303C is preferably a long film-shaped conductor extending along the length direction of the dielectric body 90C. The sixth ground conductor 303C includes three portions, a third signal conductor ground portion 303C1, a fourth signal conductor ground portion 303C2, and an intermediate portion 303C3, along the width direction thereof. The third signal conductor ground portion 303C1, the fourth signal conductor ground portion 303C2, and the intermediate portion 303C3 are integrally formed. These portions are disposed in the order of the third signal conductor ground portion 303C1, the intermediate portion 303C3, and the fourth signal conductor ground portion 303C2, along the width direction of the dielectric body 90C, from the first side surface adjacent to the third signal conductor 213C toward the second side surface adjacent to the fourth signal conductor 214C.

The third signal conductor ground portion 303C1 of the sixth ground conductor 303C is preferably wider than the third signal conductor 213C. The third signal conductor ground portion 303C1 is preferably disposed closer to the first side (upper side in FIG. 9) of the dielectric body 90C in the thickness direction than the third signal conductor 213C.

The fourth signal conductor ground portion 303C2 of the sixth ground conductor 303C is preferably wider than the fourth signal conductor 214C. The fourth signal conductor ground portion 303C2 is preferably disposed closer to the second side (lower side in FIG. 9) of the dielectric body 90C in the thickness direction than the fourth signal conductor 214C.

The intermediate portion 303C3 of the sixth ground conductor 303C is disposed between the third signal conductor 213C and the fourth signal conductor 214C in the width direction of the dielectric body 90C. It is preferable that the film surface of the intermediate portion 303C3 is closer to being parallel to the thickness direction of the dielectric body 90C. In other words, it is preferable that the film surface of the intermediate portion 303C3 is closer to being orthogonal to the direction in which the third signal conductor 213C and the fourth signal conductor 214C are arranged.

The seventh ground conductor 440C is preferably wider than the fourth signal conductor 214C. The seventh ground conductor 440C is preferably disposed closer to the first side (upper side in FIG. 9) of the dielectric body 90C in the thickness direction than the fourth signal conductor 214C.

The seventh ground conductor 440C includes long conductors 441C and 442C and a plurality of bridge conductors 443C. The long conductors 441C and 442C extend along the length direction of the dielectric body 90C. The long conductors 441C and 442C are arranged, with the fourth signal conductor 214C interposed therebetween, in the width direction of the dielectric body 90C. The long conductors 441C and 442C preferably do not overlap the fourth signal conductor 214C when the dielectric body 90C is viewed in the thickness direction. The bridge conductors 443C are arranged at intervals along the direction in which the long conductors 441C and 442C extend, and connect the long conductors 441C and 442C. The long conductors 441C and 442C are connected by the corresponding interlayer connection conductors 540C to the fourth signal conductor ground portion 303C2 of the sixth ground conductor 303C.

With this configuration, as illustrated in FIG. 9, the first, second, third, and fourth transmission lines 101C, 102C, 103C, and 104C are provided in the dielectric body 90C. The first transmission line 101C is preferably a stripline transmission line in which the first signal conductor 211C is sandwiched between the first signal conductor ground portion 301C1 of the first ground conductor 301C and the second ground conductor 410C along the thickness direction of the dielectric body 90C. The second transmission line 102C is preferably a stripline transmission line in which the second signal conductor 212C is sandwiched between the second signal conductor ground portion 301C2 of the first ground conductor 301C and the second signal conductor ground portion 302C2 of the fourth ground conductor 302C along the thickness direction of the dielectric body 90C. The third transmission line 103C is preferably a stripline transmission line in which the third signal conductor 213C is sandwiched between the third signal conductor ground portion 302C1 of the fourth ground conductor 302C and the third signal conductor ground portion 303C1 of the sixth ground conductor 303C along the thickness direction of the dielectric body 90C. The fourth transmission line 104C is preferably a stripline transmission line in which the fourth signal conductor 214C is sandwiched between the fourth signal conductor ground portion 303C2 of the sixth ground conductor 303C and the seventh ground conductor 440C along the thickness direction of the dielectric body 90C.

The first, second, third, and fourth transmission lines 101C, 102C, 103C, and 104C are transmission lines extending along the length direction of the dielectric body 90C. The first transmission line 101C and the second transmission line 102C are arranged along the width direction of the dielectric body 90C. The first transmission line 101C and the third transmission line 103C are arranged along the thickness direction of the dielectric body 90C. The first transmission line 101C and the third transmission line 103C coincide or overlap with each other in plan view of the dielectric body 90C. The second transmission line 102C and the fourth transmission line 104C are arranged along the thickness direction of the dielectric body 90C. The second transmission line 102C and the fourth transmission line 104C coincide or overlap with each other in plan view of the dielectric body 90C. The third transmission line 103C and the fourth transmission line 104C are arranged along the width direction of the dielectric body 90C.

The intermediate portion 301C3 of the first ground conductor 301C is disposed between the first transmission line 101C and the second transmission line 102C. The intermediate portion 301C3 has a film surface orthogonal or substantially orthogonal to the direction in which the first signal conductor 211C and the second signal conductor 212C are arranged. This significantly reduces or prevents electromagnetic field coupling between the first signal conductor 211C and the second signal conductor 212C.

The intermediate portion 303C3 of the sixth ground conductor 303C is disposed between the third transmission line 103C and the fourth transmission line 104C. The intermediate portion 303C3 includes a film surface orthogonal or substantially orthogonal to the direction in which the third signal conductor 213C and the fourth signal conductor 214C are arranged. This significantly reduces or prevents electromagnetic field coupling between the third signal conductor 213C and the fourth signal conductor 214C.

The first signal conductor ground portion 301C1 of the first ground conductor 301C and the third signal conductor ground portion 302C1 of the fourth ground conductor 302C are disposed between the first signal conductor 211C and the third signal conductor 213C. This significantly reduces or prevents electromagnetic field coupling between the first signal conductor 211C and the third signal conductor 213C.

The second signal conductor ground portion 302C2 of the fourth ground conductor 302C and the fourth signal conductor ground portion 303C2 of the sixth ground conductor 303C are disposed between the second signal conductor 212C and the fourth signal conductor 214C. This significantly reduces or prevents electromagnetic field coupling between the second signal conductor 212C and the fourth signal conductor 214C.

With this configuration, even if the first signal conductor 211C and the second signal conductor 212C are close to each other in the width direction of the dielectric body 90C, the third signal conductor 213C and the fourth signal conductor 214C are close to each other in the width direction of the dielectric body 90C, the first signal conductor 211C and the third signal conductor 213C are close to each other in the thickness direction of the dielectric body 90C, and the second signal conductor 212C and the fourth signal conductor 214C are close to each other in the thickness direction of the dielectric body 90C, electromagnetic field coupling between the first signal conductor 211C, the second signal conductor 212C, the third signal conductor 213C, and the fourth signal conductor 214C is significantly reduced or prevented. Therefore, a high level of isolation between the first transmission line 101C, the second transmission line 102C, the third transmission line 103C, and the fourth transmission line 104C is ensured.

As in the preferred embodiments described above, the width of the dielectric body 90C is able to be reduced. It is, thus, possible to provide the transmission line 100 having a small size that ensures a high level of isolation between the first transmission line 101C, the second transmission line 102C, the third transmission line 103C, and the fourth transmission line 104C.

In the configuration of the present preferred embodiment, the region between the first signal conductor 211C and the first signal conductor ground portion 301C1 in the first transmission line 101C along the thickness direction and the region between the second signal conductor 212C and the second signal conductor ground portion 301C2 in the second transmission line 102C along the thickness direction overlap in the thickness direction of the dielectric body 90C. Also, the region between the third signal conductor 213C and the third signal conductor ground portion 303C1 in the third transmission line 103C along the thickness direction and the region between the fourth signal conductor 214C and fourth signal conductor ground portion 303C2 in the fourth transmission line 104C along the thickness direction overlap in the thickness direction of the dielectric body 90C. This reduces the profile of the dielectric body 90C and the size of the transmission line 100.

Thus, even when the dielectric body 90C includes four transmission lines as described above, it is still possible to provide a transmission line 100 having a narrow width and a low profile.

The impedance of the first transmission line 101C and the third transmission line 103C in the transmission line 100 is able to be determined in the same manner as the impedance of the first and second transmission lines 101 and 102 described in the first preferred embodiment. The impedance of the second transmission line 102C and the fourth transmission line 104C in the transmission line 100 is able to be determined in the same manner as the impedance of the second transmission line 102B according to the third preferred embodiment.

In the transmission line 100, the first signal conductor ground portion 301C1 of the first ground conductor 301C and the third signal conductor ground portion 302C1 of the fourth ground conductor 302C are close to each other in the thickness direction of the dielectric body 90C. Also, the first signal conductor ground portion 301C1 and the third signal conductor ground portion 302C1 are connected to each other by a plurality of interlayer connection conductors 591.

Similarly, the second signal conductor ground portion 302C2 of the fourth ground conductor 302C and the fourth signal conductor ground portion 303C2 of the sixth ground conductor 303C are close to each other in the thickness direction of the dielectric body 90C. Also, the second signal conductor ground portion 302C2 and the fourth signal conductor ground portion 303C2 are connected to each other by a plurality of interlayer connection conductors 592. It is, thus, possible to reduce a potential difference between the ground conductors.

In plan view of the dielectric body 90C, the interlayer connection conductors 591 are preferably disposed at positions coinciding or overlapping with the interlayer connection conductors 510C and 530C. This reduces deformation of the first signal conductor ground portion 301C1 of the first ground conductor 301C and the third signal conductor ground portion 302C1 of the fourth ground conductor 302C during molding of the dielectric body 90C. Similarly, the interlayer connection conductors 592 are disposed at positions coinciding or overlapping with the interlayer connection conductors 520C and 540C. This reduces deformation of the second signal conductor ground portion 302C2 of the fourth ground conductor 302C and the fourth signal conductor ground portion 303C2 of the sixth ground conductor 303C during molding of the dielectric body 90C. It is, thus, possible to reduce changes in the positional relationship between the signal and ground conductors caused by molding, and to achieve a desired impedance.

The transmission line 100 having the structure described above is manufactured, for example, in the following non-limiting example of a manufacturing method.

As illustrated in FIG. 10, dielectric layers 901C, 902C, 903C, 904C, 905C, 906C, 907C, 908C, 909C, 910C, 911C, 912C, and 913C are prepared. For example, the dielectric layers 901C to 913C can each be obtained by forming a predetermined conductive pattern, as necessary, on a dielectric film made of a material primarily composed of liquid crystal polymer.

The dielectric layer 901C is formed by a dielectric film including no conductor thereon. The width of the dielectric layer 901C is preferably the same or substantially the same as the width of the dielectric body 90C.

The dielectric layer 902C is formed by a dielectric film including a conductor (e.g., copper (Cu)) applied to one side thereof. For example, by patterning the conductor on the surface of the dielectric layer 902C, the second ground conductor 410C is formed on the surface of the dielectric layer 902C as illustrated in FIG. 10. The width of the dielectric layer 902C is preferably about half the width of the dielectric body 90C. The dielectric layer 902C is preferably disposed in a first half region of the dielectric body 90C in the width direction.

The dielectric layer 903C is formed by a dielectric film including a conductor (e.g., copper (Cu)) applied to one side thereof. For example, by patterning the conductor on the surface of the dielectric layer 903C, the first signal conductor 211C and the via auxiliary conductors 511 are formed on the surface of the dielectric layer 903C as illustrated in FIG. 10. The width of the dielectric layer 903C is preferably about half the width of the dielectric body 90C. The dielectric layer 903C is preferably disposed in the first half region of the dielectric body 90C in the width direction to coincide or overlaps with the dielectric layer 902C.

The via auxiliary conductors 511 are provided in regions that overlap the corresponding long conductors 411C and 412C of the second ground conductor 410C when the dielectric layer 903C is disposed over the dielectric layer

902C. The dielectric layer 903C is provided with a plurality of through holes passing therethrough in the thickness direction, in regions that overlap the corresponding long conductors 411C and 412C of the second ground conductor 410C (i.e., regions coinciding with the respective via auxiliary conductors 511) when the dielectric layer 903C is disposed over the dielectric layer 902C. The through holes are each filled with a conductive paste. Thermal pressure bonding of the dielectric layers 901C to 913C enables the conductive paste in the through holes to form a portion of the interlayer connection conductors 510C as well as the via auxiliary conductors 511.

The dielectric layer 904C is formed by a dielectric film including a conductor (e.g., copper (Cu)) applied to one side thereof. For example, by patterning the conductor on the surface of the dielectric layer 904C, the first ground conductor 301C is formed on the surface of the dielectric layer 904C as illustrated in FIG. 10. The width of the dielectric layer 904C is preferably the same or substantially the same as the width of the dielectric body 90C. The first ground conductor 301C is formed on substantially the entire surface of the dielectric layer 904C. The first ground conductor 301C preferably does not extend to either end surface of the dielectric layer 904C in the width direction. It is, thus, possible to prevent the occurrence of an undesired short circuit between the first ground conductor 301C and an external circuit.

The dielectric layer 904C is provided with a plurality of through holes at positions coinciding or overlapping with the respective via auxiliary conductors 511 on the dielectric layer 903C when the dielectric layer 904C is disposed over the dielectric layer 903C. The through holes are each filled with a conductive paste. Thermal pressure bonding of the dielectric layers 901C to 913C enables the conductive paste in the through holes to form a portion of the interlayer connection conductors 510C.

The dielectric layer 905C is formed by a dielectric film including a conductor (e.g., copper (Cu)) applied to one side thereof. For example, by patterning the conductor on the surface of the dielectric layer 905C, the second signal conductor 212C and the via auxiliary conductors 521 are formed on the surface of the dielectric layer 905C as illustrated in FIG. 10. The width of the dielectric layer 905C is preferably about half the width of the dielectric body 90C. The dielectric layer 905C is preferably disposed in a second half region of the dielectric body 90C in the width direction. The via auxiliary conductors 521 are arranged, with the second signal conductor 212C interposed therebetween, in the width direction of the dielectric layer 905C. The dielectric layer 905C is provided with a plurality of through holes in regions that coincide or overlap with the respective via auxiliary conductors 521. The through holes are each filled with a conductive paste. Thermal pressure bonding of the dielectric layers 901C to 913C enables the conductive paste in the through holes to form a portion of the interlayer connection conductors 520C as well as the via auxiliary conductors 521.

The dielectric layer 906C is formed by a dielectric film including a conductor (e.g., copper (Cu)) applied to one side thereof. For example, by patterning the conductor on the surface of the dielectric layer 906C, the via auxiliary conductors 521 are formed on the surface of the dielectric layer 906C as illustrated in FIG. 10. The width of the dielectric layer 906C is preferably about half the width of the dielectric body 90C. The dielectric layer 906C is preferably disposed in the second half region of the dielectric body 90C in the width direction. The via auxiliary conductors 521 are provided at positions that coincide or overlap with the respective via auxiliary conductors 521 on the dielectric layer 905C when the dielectric layer 906C is disposed over the dielectric layer 905C. The dielectric layer 906C is provided with a plurality of through holes in regions that coincide or overlap with the via auxiliary conductors 521. The through holes are each filled with a conductive paste. Thermal pressure bonding of the dielectric layers 901C to 913C enables the conductive paste in the through holes to form a portion of the interlayer connection conductors 520C as well as the via auxiliary conductors 521. The dielectric layer 906C is a dielectric layer that adjusts the impedance of the second transmission line 102C by setting the distance between the second signal conductor 212C and the fourth ground conductor 302C at a predetermined value.

The dielectric layer 907C is formed by a dielectric film including a conductor (e.g., copper (Cu)) applied to one side thereof. For example, by patterning the conductor on the surface of the dielectric layer 907C, the fourth ground conductor 302C is formed on the surface of the dielectric layer 907C as illustrated in FIG. 10. The width of the dielectric layer 907C is preferably the same or substantially the same as the width of the dielectric body 90C. The fourth ground conductor 302C is formed on substantially the entire surface of the dielectric layer 907C. The fourth ground conductor 302C preferably does not extend to either end surface of the dielectric layer 907C in the width direction. It is, thus, possible to prevent the occurrence of an undesired short circuit between the fourth ground conductor 302C and an external circuit.

The dielectric layer 907C is provided with a plurality of through holes in the first half region of the dielectric body 90C in the width direction, and the through holes are each filled with a conductive paste. Thermal pressure bonding of the dielectric layers 901C to 913C enables the conductive paste in the through holes in the first half region to form the interlayer connection conductors 591.

The dielectric layer 908C is formed by a dielectric film including a conductor (e.g., copper (Cu)) applied to one side thereof. For example, by patterning the conductor on the surface of the dielectric layer 908C, the third signal conductor 213C and the via auxiliary conductors 531 are formed on the surface of the dielectric layer 908C as illustrated in FIG. 10. The width of the dielectric layer 908C is preferably about half the width of the dielectric body 90C. The dielectric layer 908C is preferably disposed in the first half region of the dielectric body 90C in the width direction. The via auxiliary conductors 531 are arranged, with the third signal conductor 213C interposed therebetween, in the width direction of the dielectric layer 908C. The dielectric layer 908C is provided with a plurality of through holes in regions that coincide or overlap with the respective via auxiliary conductors 531. The through holes are each filled with a conductive paste. Thermal pressure bonding of the dielectric layers 901C to 913C enables the conductive paste in the through holes to form a portion of the interlayer connection conductors 530C as well as the via auxiliary conductors 531.

The dielectric layer 909C is formed by a dielectric film including a conductor (e.g., copper (Cu)) applied to one side thereof. For example, by patterning the conductor on the surface of the dielectric layer 909C, the via auxiliary conductors 531 are formed on the surface of the dielectric layer 909C as illustrated in FIG. 10. The width of the dielectric layer 909C is preferably about half the width of the dielectric body 90C. The dielectric layer 909C is preferably disposed in the first half region of the dielectric body 90C in the width direction. The via auxiliary conductors 531 are provided at positions that coincide or overlap with the respective via auxiliary conductors 531 on the dielectric layer 908C when the dielectric layer 909C is disposed over the dielectric layer 908C. The dielectric layer 909C is provided with a plurality of through holes in regions that coincide with the via auxiliary conductors 531. The through holes are each filled with a conductive paste. Thermal pressure bonding of the dielectric layers 901C to 913C enables the conductive paste in the through holes to form a portion of the interlayer connection conductors 530C as well as the via auxiliary conductors 531. The dielectric layer 909C is a dielectric layer that adjusts the impedance of the third transmission line 103C by setting the distance between the third signal conductor 213C and the sixth ground conductor 303C at a predetermined value.

The dielectric layer 910C is formed by a dielectric film including a conductor (e.g., copper (Cu)) applied to one side thereof. For example, by patterning the conductor on the surface of the dielectric layer 910C, the sixth ground conductor 303C is formed on the surface of the dielectric layer 910C as illustrated in FIG. 10. The width of the dielectric layer 910C is preferably the same or substantially the same as the width of the dielectric body 90C. The sixth ground conductor 303C is formed on substantially the entire surface of the dielectric layer 910C. The sixth ground conductor 303C preferably does not extend to either end surface of the dielectric layer 910C in the width direction. It is, thus, possible to significantly reduce or prevent the occurrence of an undesired short circuit between the sixth ground conductor 303C and an external circuit.

The dielectric layer 910C is provided with a plurality of through holes in the second half region of the dielectric body 90C in the width direction, and the through holes are each filled with a conductive paste. Thermal pressure bonding of the dielectric layers 901C to 913C enables the conductive paste in the through holes in the second half region to form the interlayer connection conductors 592.

The dielectric layer 911C is formed by a dielectric film including a conductor (e.g., copper (Cu)) applied to one side thereof. For example, by patterning the conductor on the surface of the dielectric layer 911C, the fourth signal conductor 214C and via auxiliary conductors 541 are formed on the surface of the dielectric layer 911C as illustrated in FIG. 10. The width of the dielectric layer 911C is preferably about half the width of the dielectric body 90C. The dielectric layer 911C is preferably disposed in the second half region of the dielectric body 90C in the width direction. The via auxiliary conductors 541 are arranged, with the fourth signal conductor 214C interposed therebetween, in the width direction of the dielectric layer 911C. The dielectric layer 911C is provided with a plurality of through holes in regions that coincide or overlap with the respective via auxiliary conductors 541. The through holes are each filled with a conductive paste. Thermal pressure bonding of the dielectric layers 901C to 913C enables the conductive paste in the through holes to form a portion of the interlayer connection conductors 540C as well as the via auxiliary conductors 541.

The dielectric layer 912C is formed by a dielectric film including a conductor (e.g., copper (Cu)) applied to one side thereof. For example, by patterning the conductor on the surface of the dielectric layer 912C, the seventh ground conductor 440C is formed on the surface of the dielectric layer 912C as illustrated in FIG. 10. The width of the dielectric layer 912C is preferably about half the width of the dielectric body 90C. The dielectric layer 912C is preferably disposed in the second half region of the dielectric body 90C in the width direction.

The dielectric layer 913C is formed by a dielectric film including no conductor thereon. The width of the dielectric layer 913C is preferably the same or substantially the same as the width of the dielectric body 90C.

As illustrated in FIG. 10, the dielectric layers 901C to 913C configured as described above are stacked in the order of the dielectric layer 901C, the dielectric layer 902C, the dielectric layer 903C, the dielectric layer 904C, the dielectric layer 905C, the dielectric layer 906C, the dielectric layer 907C, the dielectric layer 908C, the dielectric layer 909C, the dielectric layer 910C, the dielectric layer 911C, the dielectric layer 912C, and the dielectric layer 913C.

After the dielectric layers 901C to 913C are stacked, the resulting multilayer body is sandwiched by a mold from both ends in the stacking direction and thermally pressure-bonded under predetermined conditions. Thus, the dielectric layer 904C including the first ground conductor 301C formed thereon is bent in the middle or the approximate middle in the width direction (more specifically, bent at a boundary between the region of the dielectric layer 903C and the region of the dielectric layer 905C when the multilayer body is viewed in the stacking direction). The first ground conductor 301C is, thus, shaped into the intermediate portion 301C3 having a flat film surface parallel or substantially parallel to the stacking direction (thickness direction), and the first signal conductor ground portion 301C1 and the second signal conductor ground portion 301C2 connected to each other by the intermediate portion 301C3 and each having a flat film surface orthogonal or substantially orthogonal to the stacking direction. At the same time, the dielectric layer 910C including the sixth ground conductor 303C formed thereon is bent in the middle or the approximate middle in the width direction (more specifically, bent at a boundary between the region of the dielectric layer 909C and the region of the dielectric layer 911C when the multilayer body is viewed in the stacking direction). The sixth ground conductor 303C is, thus, shaped into the intermediate portion 303C3 having a flat film surface parallel or substantially parallel to the stacking direction (thickness direction), and the third signal conductor ground portion 303C1 and the fourth signal conductor ground portion 303C2 connected to each other by the intermediate portion 303C3 and each having a flat film surface orthogonal or substantially orthogonal to the stacking direction. Note that the fourth ground conductor 302C is flat because the thickness of dielectric layers stacked in the first half region of the dielectric body 90C in the width direction is the same or substantially the same as the thickness of dielectric layers stacked in the second half region of the dielectric body 90C in the width direction.

With the non-limiting example of a manufacturing method of the present preferred embodiment, the transmission line 100 described above is easily manufactured.

Note that the interlayer connection conductors with the configuration of the second preferred embodiment are applicable to the interlayer connection conductors with the configuration of the third and fourth preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
 a plate-shaped dielectric body including a plurality of dielectric layers that are stacked;

a first signal conductor and a second signal conductor disposed inside the dielectric body, extending along a transmission direction of high-frequency signals, and spaced apart in a width direction of the dielectric body orthogonal or substantially orthogonal to the transmission direction; and a first ground conductor disposed inside the dielectric body and common to the first signal conductor and the second signal conductor; wherein the first ground conductor includes:
- a first signal conductor ground portion disposed closer to a first side of the dielectric body in a thickness direction than the first signal conductor and facing a principal surface of the first signal conductor;
- a second signal conductor ground portion disposed closer to a second side of the dielectric body in the thickness direction than the second signal conductor and facing a principal surface of the second signal conductor; and
- an intermediate portion that connects the first signal conductor ground portion to the second signal conductor ground portion;

along the thickness direction of the dielectric body, a region between the first signal conductor and the first signal conductor ground portion is defined as a first region and a region between the second signal conductor and the second signal conductor ground portion is defined as a second region, a second end portion of the second region in the thickness direction is disposed closer to the second side of the dielectric body in the thickness direction than a first end portion of the first region in the thickness direction; and the first signal conductor ground portion, the second signal conductor ground portion, and the intermediate portion are formed integrally as a single unitary conductor.

2. The transmission line according to claim 1, wherein each of the first and second signal conductors are film-shaped conductors extending in a length direction of the dielectric body.

3. The transmission line according to claim 1, wherein the first signal conductor ground portion is wider than the first signal conductor, and the second signal conductor ground portion is wider than the second signal conductor.

4. The transmission line according to claim 1, wherein the intermediate portion is disposed between the first signal conductor and the second signal conductor in the width direction of the dielectric body.

5. The transmission line according to claim 1, wherein the first ground conductor and a second ground conductor are disposed such that film surfaces of the first ground conductor and the second ground conductor are parallel or substantially parallel to each other.

6. The transmission line according to claim 1, further comprising:
- a fourth ground conductor partially disposed opposite to the first ground conductor with respect to the second signal conductor in the thickness direction of the dielectric body, the fourth ground conductor being disposed in substantially an entire region in the width direction of the dielectric body; and
- a third signal conductor disposed opposite to the first signal conductor with respect to the first ground conductor and the fourth ground conductor in the thickness direction of the dielectric body; wherein a first portion of the fourth ground conductor facing the third signal conductor is disposed closer to the first signal conductor than a second portion of the fourth ground conductor facing the second signal conductor in the thickness direction of the dielectric body.

7. The transmission line according to claim 6, further comprising:
- a sixth ground conductor partially disposed opposite to the fourth ground conductor with respect to the third signal conductor in the thickness direction of the dielectric body, the sixth ground conductor being disposed in substantially an entire region in the width direction of the dielectric body; and
- a fourth signal conductor disposed opposite to the second signal conductor with respect to the fourth ground conductor and the sixth ground conductor in the thickness direction of the dielectric body; wherein a first portion of the sixth ground conductor facing the fourth signal conductor is disposed closer to the second signal conductor than a second portion of the sixth ground conductor facing the third signal conductor in the thickness direction of the dielectric body.

8. The transmission line according to claim 1, further comprising:
- a second ground conductor disposed opposite to the first signal conductor ground portion with respect to the first signal conductor in the thickness direction; and
- a third ground conductor disposed opposite to the second signal conductor ground portion with respect to the second signal conductor in the thickness direction.

9. The transmission line according to claim 8, wherein the second ground conductor includes elongated conductors and a plurality of bridge conductors.

10. The transmission line according to claim 9, wherein the elongated conductors are arranged, with the first signal conductor interposed therebetween, in the width direction of the dielectric body.

11. The transmission line according to claim 9, wherein the elongated conductors do not overlap the first signal conductor when the dielectric body is viewed in the thickness direction.

12. The transmission line according to claim 9, wherein the plurality of bridge conductors are arranged at predetermined intervals along a direction in which the elongated conductors extend, and connect the elongated conductors to one another.

13. The transmission line according to claim 9, further comprising:
interlayer connection conductors; wherein
the elongated conductors are connected by the interlayer connection conductors to the first signal conductor ground portion.

14. The transmission line according to claim 8, wherein the third ground conductor includes elongated conductors and a plurality of bridge conductors.

15. The transmission line according to claim 14, wherein the long conductors are arranged, with the first signal conductor interposed therebetween, in the width direction of the dielectric body.

16. The transmission line according to claim 14, wherein the elongated conductors do not overlap the second signal conductor when the dielectric body is viewed in the thickness direction.

17. The transmission line according to claim 14, wherein the plurality of bridge conductors are arranged at predetermined intervals along a direction in which the elongated conductors extend, and connect the elongated conductors to one another.

18. The transmission line according to claim 14, further comprising:

interlayer connection conductors; wherein
the elongated conductors are connected by the interlayer connection conductors to the second signal conductor ground portion.

19. A method for manufacturing a transmission line that includes a plate-shaped dielectric body including a plurality of dielectric layers that are stacked; a first signal conductor and a second signal conductor disposed inside the dielectric body, extending along a transmission direction of high-frequency signals, and spaced apart in a width direction of the dielectric body orthogonal or substantially orthogonal to the transmission direction; and a first ground conductor disposed inside the dielectric body and common to the first signal conductor and the second signal conductor, the method comprising:

a step of stacking a first dielectric layer having a width narrower than a width of the dielectric body and provided with the first signal conductor formed thereon, a second dielectric layer having a width narrower than the width of the dielectric body and provided with the second signal conductor formed thereon, and a third dielectric layer having a width the same or substantially the same as the width of the dielectric body and provided with the first ground conductor formed thereon, in the order of the first dielectric layer, the third dielectric layer, and the second dielectric layer along a stacking direction; and a step of thermally pressure-bonding the stacked first dielectric layer, third dielectric layer, and second dielectric layer to form the dielectric body including the first dielectric layer, the third dielectric layer, and the second dielectric layer; wherein in the step of stacking, the first dielectric layer and the second dielectric layer are arranged so as not to overlap each other as viewed in the stacking direction when the first dielectric layer, the third dielectric layer, and the second dielectric layer are stacked.

* * * * *